United States Patent
Yoo et al.

(10) Patent No.: US 8,735,247 B2
(45) Date of Patent: May 27, 2014

(54) METHOD FOR FABRICATING NONVOLATILE MEMORY DEVICE

(75) Inventors: Dong-Chul Yoo, Seongnam-si (KR);
Ki-Hyun Hwang, Seongnam-si (KR);
Han-Mei Choi, Seoul (KR); Jin-Gyun Kim, Yongin-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 353 days.

(21) Appl. No.: 13/204,349

(22) Filed: Aug. 5, 2011

(65) Prior Publication Data
US 2012/0052673 A1 Mar. 1, 2012

(30) Foreign Application Priority Data
Aug. 26, 2010 (KR) .................. 10-2010-0082982

(51) Int. Cl.
*H01L 21/336* (2006.01)
*H01L 21/4763* (2006.01)
*H01L 29/76* (2006.01)

(52) U.S. Cl.
USPC ............................ 438/268; 438/624; 257/328

(58) Field of Classification Search
USPC ............... 438/259, 268, 270, 624, 637, 795; 257/324, 328, 330
See application file for complete search history.

(56) References Cited

U.S. PATENT DOCUMENTS

| | | | |
|---|---|---|---|
| 7,994,011 B2 * | 8/2011 | Park et al. ................. | 438/287 |
| 2010/0320528 A1 * | 12/2010 | Jeong et al. ................ | 257/324 |
| 2011/0024816 A1 * | 2/2011 | Moon et al. ................ | 257/314 |

FOREIGN PATENT DOCUMENTS

| KR | 2009-0047614 | 5/2009 |
|---|---|---|
| KR | 2009-0123476 | 12/2009 |
| KR | 2009-0125893 | 12/2009 |

* cited by examiner

*Primary Examiner* — Hsien Ming Lee
(74) *Attorney, Agent, or Firm* — Muir Patent Consulting, PLLC

(57) ABSTRACT

A method for fabricating a nonvolatile memory device is disclosed. The method includes forming a first structure for a common source line on a semiconductor substrate, the first structure extending along a first direction, forming a mold structure by alternately stacking a plurality of sacrificial layers and a plurality of insulating layers on the semiconductor substrate, forming a plurality of openings in the mold structure exposing a portion of the first structure, and forming a first memory cell string at a first side of the first structure and a second memory cell string at a second, opposite side of the first structure. The plurality of openings include a first through-hole and a second through-hole, each through-hole passing through the plurality of sacrificial layers and plurality of insulating layers, and the first through-hole and the second through-hole overlap each other in the first direction.

10 Claims, 35 Drawing Sheets

121 (121a ~ 121g)
142 (142a ~ 142f)
144 (144a ~ 144f)

121 (121a ~ 121g)
142 (142a ~ 142f)
144 (144a ~ 144f)

121 (121a ~ 121g)
142 (142a ~ 142f)
144 (144a ~ 144f)

121 (121a ~ 121g)
123 (123a ~ 123f)

121 (121a ~ 121g)
123 (123a ~ 123f)

121 (121a ~ 121g)
141 (141a ~ 141f)
142 (142a ~ 142f)

121 (121a ~ 121g)
141 (141a ~ 141f)

121 (121a ~ 121g)
142 (142a ~ 142f)

121 (121a ~ 121g)

121 (121a ~ 121g)
142 (142a ~ 142f)
144 (144a ~ 144f)

121 (121a ~ 121g)
142 (142a ~ 142f)
144 (144a ~ 144f)

121 (121a ~ 121g)
142 (142a ~ 142f)
144 (144a ~ 144f)

121 (121a ~ 121g)
142 (142a ~ 142f)
144 (144a ~ 144f)
311 (311a ~ 311g)

121 (121a ~ 121g)
341 (341a ~ 341f)

121 (121a ~ 121g)
341 (341a ~ 341f)

121 (121a ~ 121g)
311 (311a ~ 311g)
341 (341a ~ 341f)

121 (121a ~ 121g)
311 (311a ~ 311g)
341 (341a ~ 341f)

METHOD FOR FABRICATING NONVOLATILE MEMORY DEVICE

CROSS-REFERENCE TO RELATED APPLICATIONS

This application claims priority from Korean Patent Application No. 10-2010-0082982 filed on Aug. 26, 2010 in the Korean Intellectual Property Office, and all the benefits accruing therefrom under 35 U.S.C. 119, the contents of which in its entirety are herein incorporated by reference.

BACKGROUND OF THE INVENTION

1. Field

The present disclosure relates to a method for fabricating a semiconductor device, and more specifically to a method for fabricating a nonvolatile memory device.

2. Description of the Related Art

In order to satisfy consumers' demand for excellent performance and low priced semiconductor memory devices, highly integrated semiconductor devices are required. In particular, the integration level of semiconductor devices is an important factor in determining the price of products. Thus, demands for highly integrated semiconductor devices are gradually increasing. Conventional two-dimensional or planar semiconductor memory devices are greatly influenced by the technology of patterning of finer components because the integration level is chiefly determined by the area occupied by a unit memory cell.

However, the highest-priced equipment may be used to achieve patterning of finer components of a memory device. Therefore, there may still be limits to the capability of the conventional two-dimensional semiconductor memory device even with increasing integration levels. To overcome these limits, research into a vertical cell string structure having a plurality of memory cells stacked in a three-dimensional manner is being conducted.

Highly integrated nonvolatile memory devices having a vertically stacked memory cell structure have led to a need for a mold structure included in the nonvolatile memory device to have enhanced mechanical strength.

SUMMARY

The disclosed embodiments are directed to a method for fabricating a semiconductor device, such as a nonvolatile memory device including a mold structure having enhanced mechanical strength.

The above and other objects of the present disclosure will be described in or be apparent from the following description of various embodiments.

According to one embodiment, a method for fabricating a nonvolatile memory device is disclosed. The method includes forming a first structure for a common source line on a semiconductor substrate, the first structure extending along a first direction, forming a mold structure by alternately stacking a plurality of sacrificial layers and a plurality of insulating layers on the semiconductor substrate, forming a plurality of openings in the mold structure exposing a portion of the first structure, andforming a first memory cell string at a first side of the first structure and a second memory cell string at a second, opposite side of the first structure. The plurality of openings include a first through-hole and a second through-hole, each through-hole passing through the plurality of sacrificial layers and plurality of insulating layers, and the first through-hole and the second through-hole overlap each other in the first direction.

According to another embodiment a method for fabricating a nonvolatile memory device is disclosed. The method includes defining a region for forming memory cell strings in a semiconductor substrate, forming a first common source line at a first side of the region, forming a second common source line at a second, opposite side of the region, forming a mold structure including a plurality of openings partially exposing the first and second common source lines and a connecting portion positioned between the plurality of openings, and forming first and second memory cell strings in the region.

According to another embodiment, a method of fabricating a nonvolatile memory device is disclosed. The method includes providing a semiconductor substrate, forming a mold structure by alternately stacking a plurality of sacrificial layers and a plurality of insulating layers on the semiconductor substrate, forming a plurality of semiconductor patterns vertically through the mold structure, each semiconductor pattern passing through the plurality of sacrificial layers and the plurality of insulating layers, forming a plurality of openings vertically through the mold structure, the openings separate from the semiconductor patterns, each opening passing through the plurality of sacrificial layers and the plurality of insulating layers, wherein as a result of the plurality of openings, each insulating layer of the plurality of insulating layers has a net structure, removing the plurality of sacrificial layers without removing the semiconductor patterns or the insulating layers, and forming memory cell strings along the plurality of semiconductor patterns.

BRIEF DESCRIPTION OF THE DRAWINGS

The above and other features and advantages of the present disclosure will become more apparent by describing in detail various embodiments thereof with reference to the attached drawings in which.

DETAILED DESCRIPTION

Figure 1:
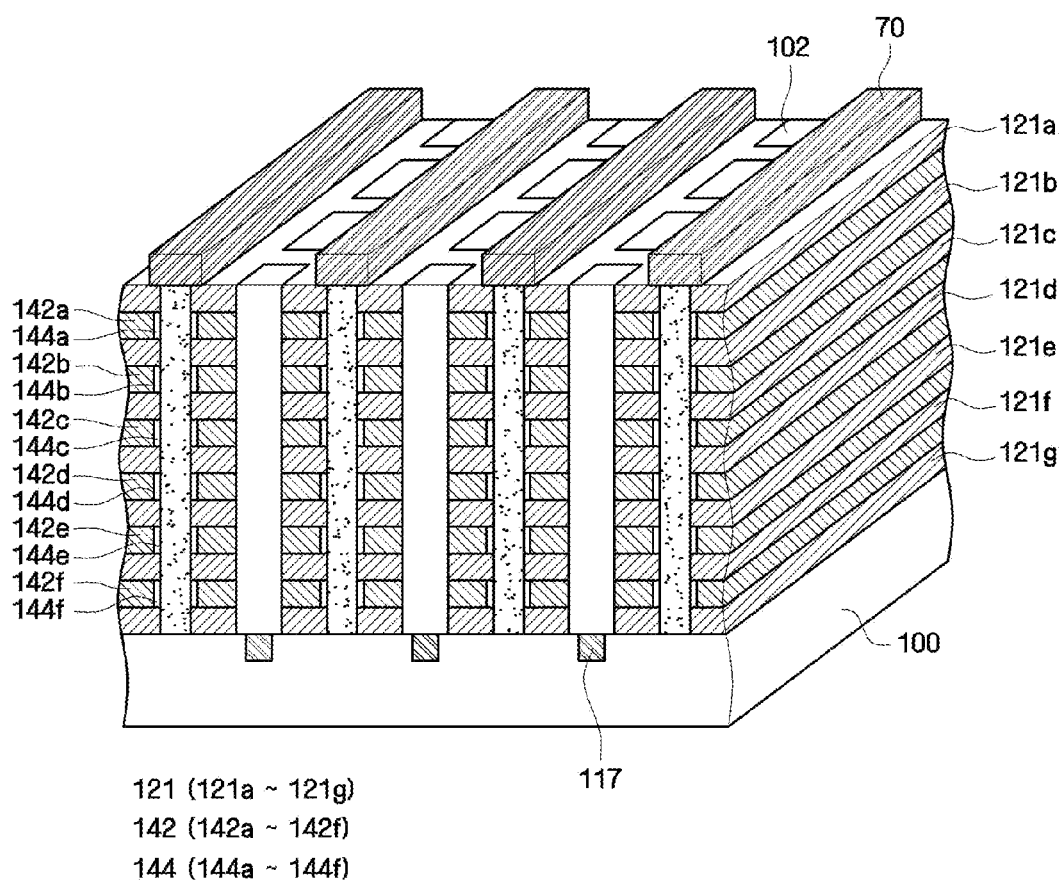
FIG. 1 is a perspective view illustrating a nonvolatile memory device according to an exemplary embodiment.

Advantages and features of the present disclosure and methods of accomplishing the same may be understood more readily by reference to the following detailed description of various embodiments and the accompanying drawings. The present invention may, however, be embodied in many different forms and should not be construed as being limited to the embodiments set forth herein.

As used herein, the term "and/or" includes any and all combinations of one or more of the associated listed items.

The terminology used herein is for the purpose of describing particular embodiments and is not intended to be limiting of the invention. As used herein, the singular forms are intended to include the plural forms as well, unless the context clearly indicates otherwise. It will be further understood that the terms "comprises," "includes," and/or "made of," when used in this specification, specify the presence of stated elements, steps, operations, and/or components, but do not preclude the presence or addition of one or more other elements, steps, operations, and/or components.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present invention.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a nonvolatile memory device according to some exemplary embodiments will be described with reference to FIGS. 1 to 26.

Figure 2:
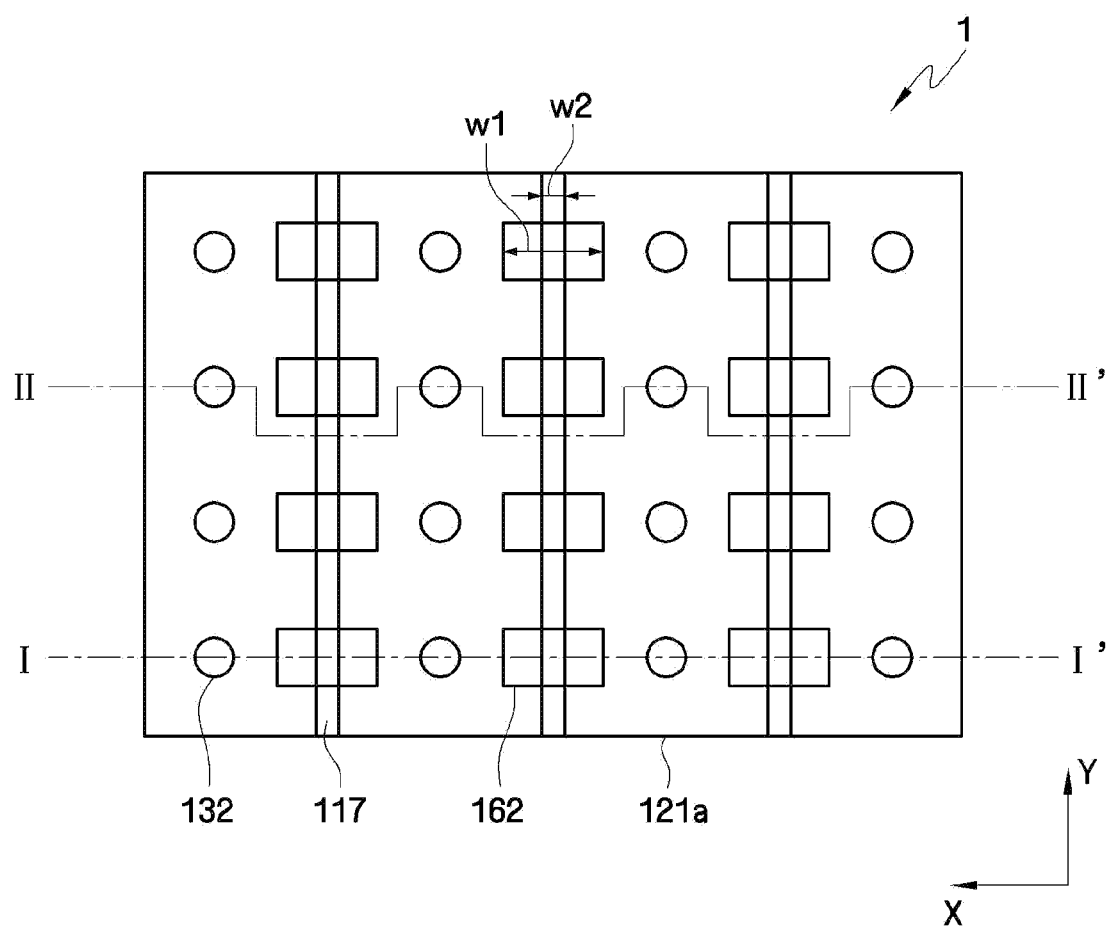
FIG. 2 is a plan view illustrating the nonvolatile memory device shown in FIG. 1.
Figure 3:
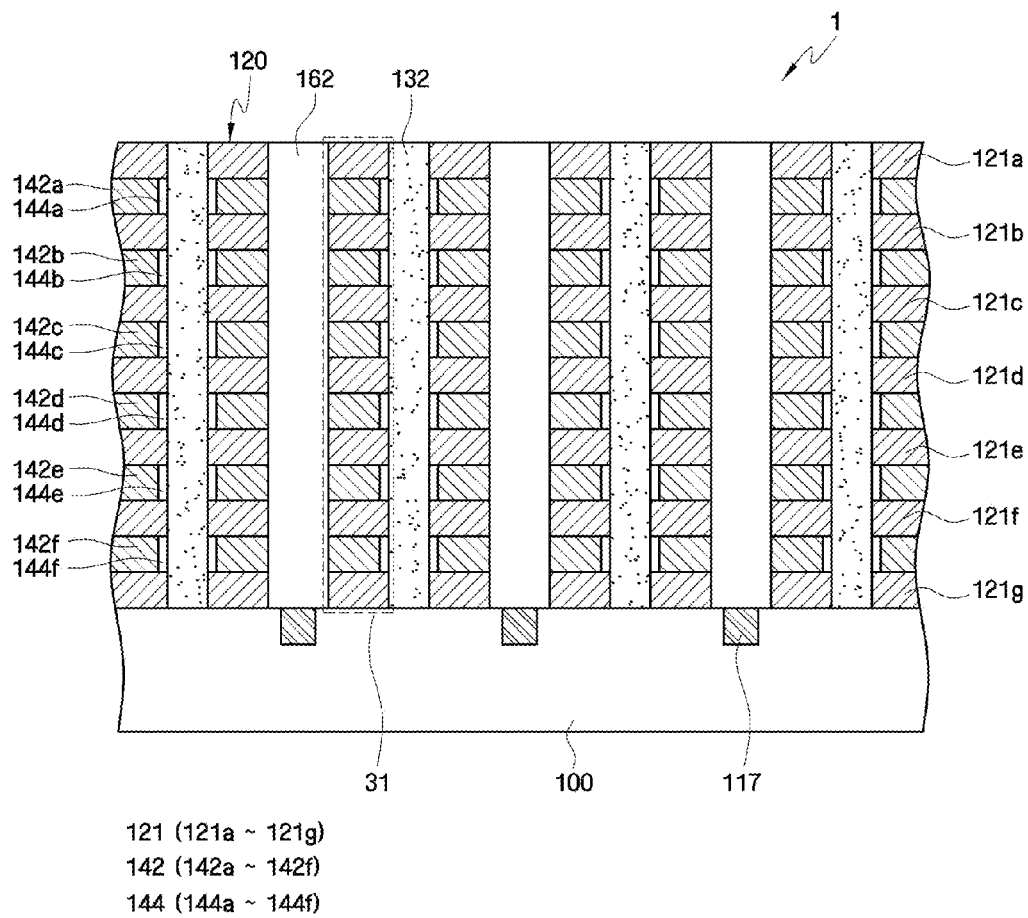
FIG. 3 is a cross-sectional view, taken along line I-I' of FIG. 2.
Figure 4:
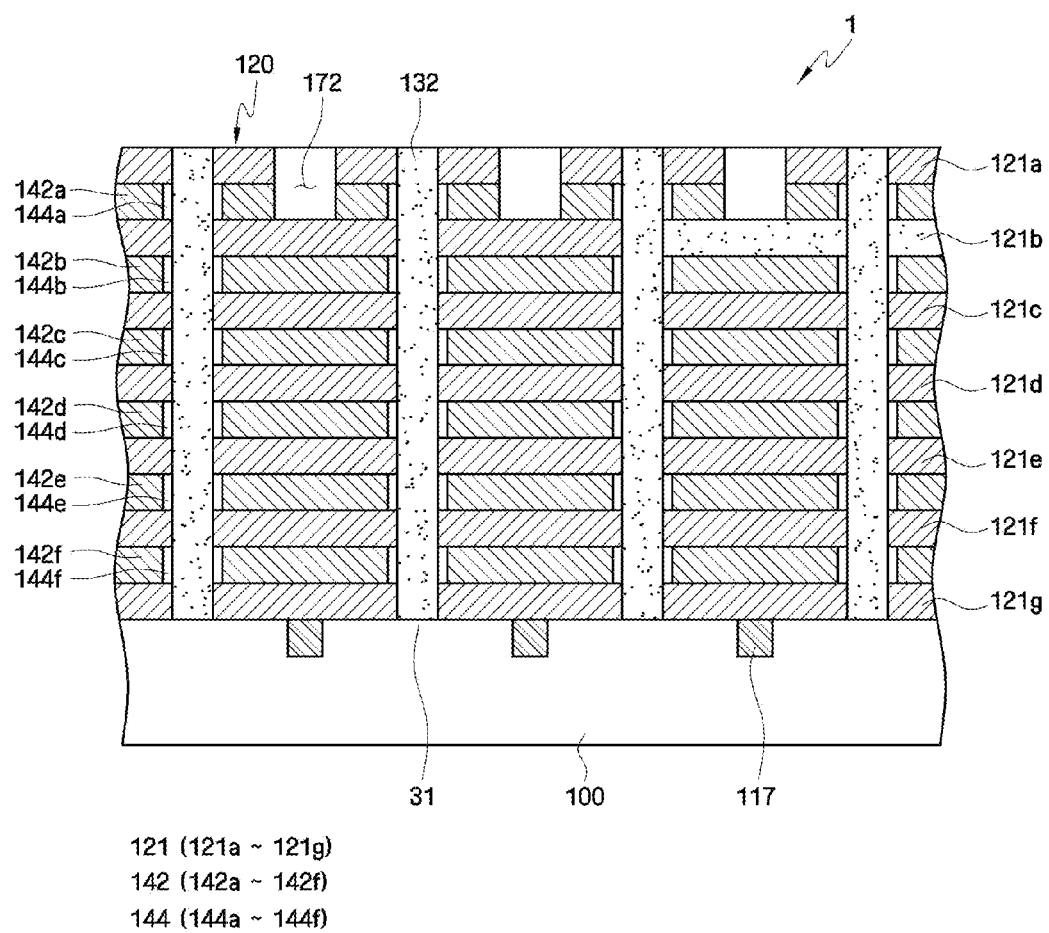
FIG. 4 is a is a cross-sectional view, taken along line II-II' of FIG. 2.
Figure 5:
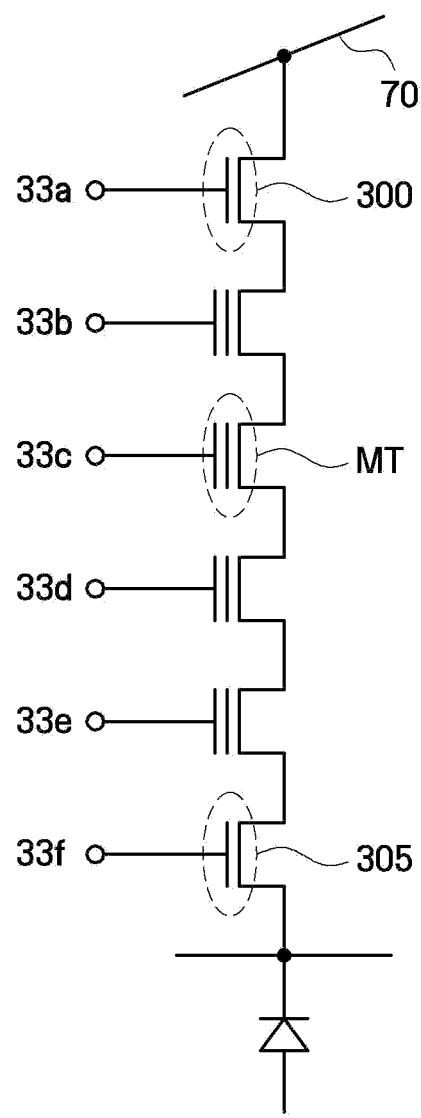
FIG. 5 illustrates an equivalent array circuit of memory cell strings included in the nonvolatile memory device shown in FIG. 1, according to one exemplary embodiment.

First, a nonvolatile memory device according to certain exemplary embodiments will be described with reference to FIGS. 1 to 5. FIG. 1 is a perspective view illustrating a nonvolatile memory device according to one exemplary embodiment, FIG. 2 is a plan view illustrating the nonvolatile memory device shown in FIG. 1, FIG. 3 is a cross-sectional view, taken along line I-I' of FIG. 2, FIG. 4 is a is a cross-sectional view, taken along line II-IF of FIG. 2, and FIG. 5 illustrates an equivalent array circuit of memory cell strings included in the nonvolatile memory device shown in FIG. 1, according to one exemplary embodiment.

Referring to FIGS. 1 to 5, the nonvolatile memory device 1 includes a semiconductor substrate 100, a mold structure 120, and memory cell strings 31.

In one embodiment, the semiconductor substrate 100 is made of a single crystal semiconductor substance. The semiconductor substrate 100 may include, for example, single crystalline silicon. A first junction region (not shown) may further be provided between the semiconductor substrate 100 and the semiconductor patterns 132. A source (not shown) may occupy a lower section of the semiconductor patterns 132.

The semiconductor substrate 100 and the source may be doped with different type conductive dopants. In an exemplary embodiment, the semiconductor substrate 100 may be of p-type doped with 3B Group element in the Periodic Table, e.g., boron (B), into single crystalline silicon, and the source may be of n-type doped with 5B Group element, e.g., phosphorus (P), into single crystalline silicon.

In one embodiment, the semiconductor substrate 100 may include a common source line 117. The common source line 117 may extend along, for example, a first direction (Y-axis) of the semiconductor substrate 100. The common source line 117 may be made of, for example, silicide including cobalt (Co) or nickel (Ni). In one embodiment, the common source line 117 is electrically connected to the source formed in the semiconductor substrate 100.

A plurality of pillar-shaped (i.e., columnar-shaped) semiconductor patterns 132 extending in a direction perpendicular to the semiconductor substrate 100 may be formed on the semiconductor substrate 100. In one embodiment, the semiconductor patterns 132 are regularly arranged on the semiconductor substrate 100. For example, the semiconductor patterns 132 may be arranged in rows parallel with the common source line 117 in the first direction, and may be arranged at regular intervals (e.g., each spaced equally distant from each other in the first direction, and equally distant from each other in a second direction perpendicular to the first direction). In one embodiment, semiconductor patterns 132 may be positioned at a first side and a second, opposite side of one common source line 117, and may be arranged in rows extending in the first direction.

The semiconductor patterns 132 may be made of, for example, single crystal silicon. In an exemplary embodiment, the semiconductor patterns 132 may be of the same conductive type as the semiconductor substrate 100, for example, p-type single crystal silicon. In one embodiment, the semiconductor patterns 132 may be formed by forming amorphous silicon and heating the amorphous silicon to change the phase of the amorphous silicon into single crystal silicon. Alternatively, the semiconductor patterns 132 may be formed by performing epitaxial growth on the semiconductor substrate 100 as a seed.

One of the semiconductor patterns 132 may include a plurality of cell transistors forming a memory cell string 31. The plurality of cell transistors may be vertically connected to one another in series. In general, $2^m$ (Here, m is a natural number equal to or greater than 1.) cell transistors may be formed in one memory cell string 31 formed on the semiconductor substrate 100.

In the nonvolatile memory device 1 according to one embodiment, if the number of cell transistors included in the memory cell string 31 is increased, a stack height of the cell transistors may increase accordingly. In the following description, a case where the memory cell string 31 includes 6 cell transistors connected in series is described.

In one embodiment, the memory cell string 31 may include a gate group 142 constituting cell transistors. The gate group 142 may include a plurality of gate electrodes 142a-142f.

The gate electrode 142f positioned in the bottommost layer among the plurality of gate electrodes 142a-142f may be used as a lower select gate, the gate electrode 142a positioned in the topmost layer among the plurality of gate electrodes 142a-142f may be used as an upper select gate, and the gate electrodes 142b-142e positioned in the intermediate layers among the plurality of gate electrodes 142a-142f may be used as various control gates. The plurality of gate electrodes 142a-142f may have horizontal plate shapes. The semiconductor patterns 132 may penetrate the gate group 142 in a vertical direction. A drain (not shown) and a source (not shown) may be disposed at upper and lower ends of the semiconductor patterns 132. Bit lines 70 may be electrically connected to the semiconductor patterns 132, and may also be directly physically connected to the semiconductor patterns 132, such that they contact semiconductor patterns 132. In addition, the bit lines 70 and the semiconductor patterns 132 may be electrically connected to each other through plugs. The gate group 142 may be made of a conductive material, for example, tungsten (W), cobalt (Co) or nickel (Ni), or silicon, but not limited thereto.

The plurality of gate electrodes 142a-142f may have the same thickness or different thicknesses. Since the thickness of each of the plurality of gate electrodes 142a-142f determines a channel length, the thicknesses can be arbitrarily selected within a range in which short channel related problems can be overcome.

Although not shown, the nonvolatile memory device 1 may further include a peripheral region including a peripheral circuit that operates the memory cell string 31. In exemplary embodiments, the peripheral circuit may include an upper select line driver electrically connected to the upper select gate 142a, a word line driver electrically connected to the plurality of control gates 142b-142e, and a lower select line driver electrically connected to the lower select gate 142f.

A charge storage layer group 144 may be positioned between the gate group 142 and the semiconductor patterns 132. More specifically, charge storage layers 144a-144f may be positioned between the gate electrodes 142a-142f and the semiconductor patterns 132. As such, charge storage layers 144a-144f may surround certain portions of the semiconductor patterns 132, and gate electrodes 142a-142f may surround respective charge storage layers 144a-144f. In one embodiment, the charge storage layers 144a-144f positioned between the gate group 142 and the semiconductor patterns 132 may store information by trapping charges. In example embodiments, the charge storage layers 144a-144f may be formed of an ONO layer, an ONA layer, or an ONOA layer.

If the charge storage layers 144a-144f are formed of, for example, ONO layers, a silicon nitride layer traps charges to store information, one of two silicon nitride layers may function as a tunnel insulating layer, and the other may function as a blocking insulating layer. In another embodiment, if the charge storage layers 144a-144f are formed of, for example, ONA layers, a silicon nitride layer traps charges to store information, and one of a silicon oxide layer and an alumina layer may function as a tunnel insulating layer, and the other may function as a blocking insulating layer.

The charge storage layers 144a and 144f disposed between the lower select gate 142f and the semiconductor patterns 132 and between the upper select gate 142a and the semiconductor patterns 132 may be used as gate insulating layers. Additional examples of three-dimensional memory devices, their fabrication, and their operation, are described in U.S. Pat. No. 7,679,133, issued to Son et al., and incorporated herein in its entirety by reference.

In one embodiment, the memory cell string 31 is supported by the mold structure 120. The mold structure 120 may include an insulating layer group 121 including insulating layers 121a-121g positioned between the gate electrodes 142a-142f constituting cell transistors. The insulating layers 121a-121g may insulate the gate electrodes 142a-142f positioned in the respective layers from each other. In the nonvolatile memory device 1 according to one embodiment, the insulating layers 121a-121g are formed to have a net structure in certain portions of each insulating layer are openings. For example, the respective insulating layers 121a-121g may include an opening (see 161 of FIG. 11C) including a plurality of through-holes (see 161a-161d of FIG. 11C) partially exposing the common source line 117. In addition, a connecting portion 163 may be positioned between each of the plurality of through-holes 161a-161d of the opening 161 to connect the plurality of through-holes 161a-161d to one another. Stated another way, each insulating layer may be formed in a net structure that includes first continuous portions extending from a first edge of the insulating layer to a second edge of the insulating layer in a first direction perpendicular to a vertical direction and second continuous portions extending from a third edge of the insulating layer to a fourth edge of the insulating layer in a second direction perpendicular to the vertical direction and the first direction. As such, the insulating layer may form a net, or mesh pattern. Each insulating layer may have the same aligned net structure to form through-holes passing through the entire mold structure 120. In one embodiment, through-holes 161a-161d are aligned with the semiconductor patterns 132 in the first direction and form an array pattern. However, other arrangements of the through-holes may be implemented.

In one embodiment, the opening 161 may include the plurality of through-holes 161a-161d arranged in the first direction along the common source line 117. In order to enhance the mechanical strength of the mold structure of the nonvolatile memory device 1, the opening 161 may be filled with an insulating material. In example embodiments, the opening 161 may be configured such that pillar-shaped insulating patterns 162 penetrate the insulating layer group 121 on the semiconductor substrate 100. The insulating layers 121a-121g may be formed of, for example, a silicon oxide layer or a silicon nitride layer.

If the number of cell transistors included in the memory cell string 31 is increased, a stack height of the cell transistors may increase. Accordingly, the load applied to the respective insulating layers of the mold structure may increase, and the load may concentrate on a mechanically weaker portion of the mold structure. In such a case, the memory cell string 31 may be bent, and may be broken in severe cases, making it difficult to achieve integration of memory cells.

As described above, however, because the insulating layers 121a-121g of the nonvolatile memory device 1 according to certain embodiments have a net structure, the mechanical strength of each of the insulating layers 121a-121g can be enhanced. Therefore, even if the number of cell transistors included in the memory cell string 31 is increased, increasing the stack height of the cell transistors, it is possible to prevent the memory cell strings 31 from being bent or broken. Accordingly, the nonvolatile memory device 1 according to disclosed embodiments can advantageously achieve integration of memory cells.

In the nonvolatile memory device 1 according to certain embodiments, the plurality of control gates 142b-142e may be used as word lines, the upper select gate 142a may be used as upper select lines, the lower select gate 142f may be used as lower select lines, and the plurality of conductive layers 70 may be used as bit lines. A block may be defined by connecting a plurality of memory cell strings 31 to each of the bit lines. In the nonvolatile memory device 1 according to certain embodiments, an erase operation may be implemented on, for example, a block basis.

In one embodiment, the word lines may have a planar structure extending in a two-dimensional manner, substantially perpendicular to the memory cell strings 31. The lower select lines are connected to the upper select lines in series, respectively. In addition, the upper select lines may be electrically connected to the bit lines. Accordingly, a memory cell string may be independently selected.

As shown in FIG. 4, in one embodiment, the upper select gates 142a included in the respective memory cell strings may be electrically insulated from each other (e.g., by an insulating material). In order to insulate the upper select gates 142a from each other, the topmost insulating layer 121a may be partially etched. A space 172 formed by etching the upper select gate 142a and the topmost insulating layer 121a may be filled with an insulating material.

In the nonvolatile memory device 1 according to one embodiment, a program operation may be implemented by injecting charges into the charge storage layer group 144 by setting a voltage difference between a selected word line and the semiconductor pattern 132. For example, a program voltage Vprog is applied to a selected word line and electrons are injected into the charge storage layer group 144 of the memory transistors (MT) 33b-33e belonging to a word line to be programmed from the semiconductor patterns 132 using the Fowler-Nordheim tunneling effect, thereby implementing the program operation. Since the program voltage applied to the selected word line is capable of programming memory transistors belonging to unselected word lines, unintended programming can be prevented by boosting the voltage.

During a read operation, the word line WL connected to a memory transistor MT to be read among the memory transistors 33b-33e is set to, for example, 0 volts, and a read voltage Vread is set to the other word lines. As a result, the probability of a bit line being charged is determined according to whether a threshold voltage Vth of the memory transistor MT to be read is greater than 0 volts or not. Accordingly, the data stored in the memory transistor MT can be read by sensing the current of the bit line.

Figure 6:
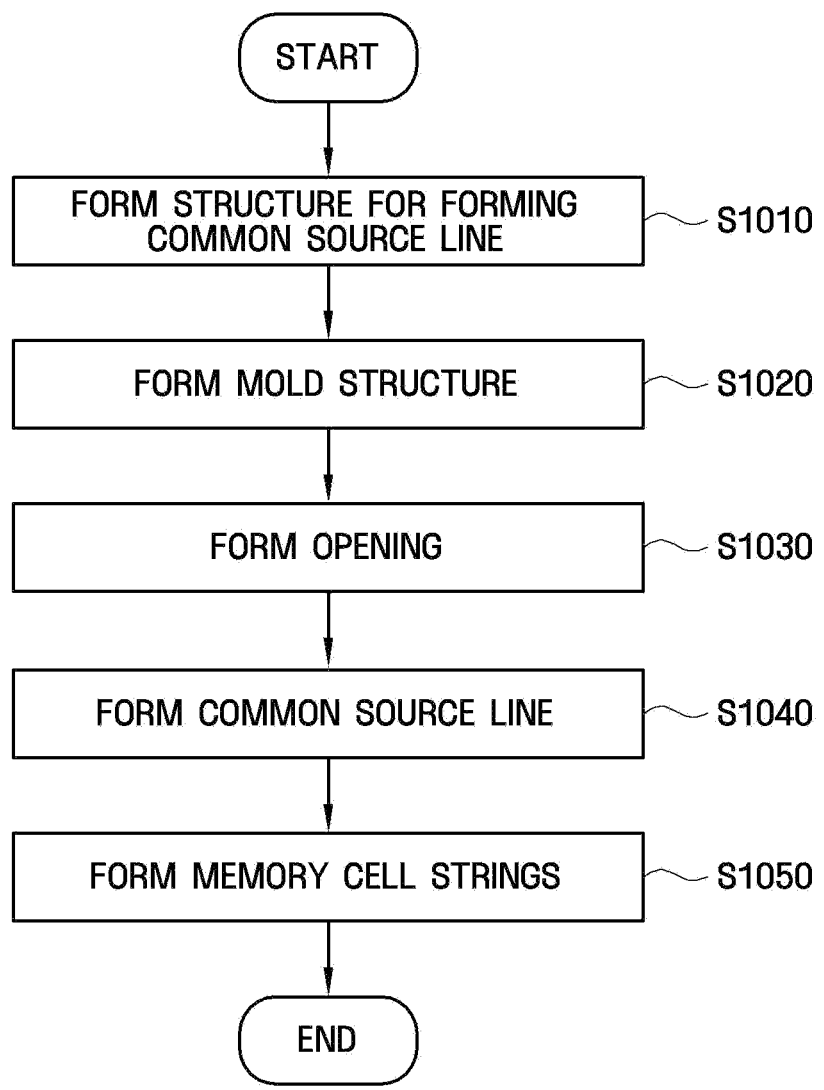
FIG. 6 is a flow chart illustrating a method for fabricating a nonvolatile memory device according to an exemplary embodiment.

An erase operation may be performed using the so-called "gate induced drain leakage current (GIDL)" on a block basis. For example, an erase voltage Verase is applied to a selected bit line and the semiconductor substrate 100 to raise a potential of the semiconductor pattern 132. Here, the potential of the semiconductor patterns 132 may rise while causing a slightly delay. Accordingly, GIDL is generated from a terminal of the lower select gate 142a and electrons generated by the GIDL are discharged to the semiconductor substrate 100 and the generated holes are discharged to the semiconductor patterns 132. Thus, a potential around the erase voltage Verase may be transferred to a channel of the memory cells (MT) 33b-33e. If the potential of the word line is set to 0 volts, electrons accumulating in the memory cells (MT) 33b-33e are discharged to the drain, thereby implementing data erasure. Meanwhile, in order to prevent an unintended erase operation, an unselected block word line may be a floating body. Hereinafter, a method for fabricating a nonvolatile memory device according to an exemplary embodiment will be described with reference to FIGS. 1 to 5 and 6 to 16B. FIG. 6 is a flow chart illustrating a method for fabricating a nonvolatile memory device according to an exemplary embodiment, and FIGS. 7 to 16B are cross-sectional views illustrating intermediate process steps for explaining a method for fabricating the nonvolatile memory device according to an exemplary embodiment. For convenience of description, the same reference numerals are used to designate components substantially identical to those of FIGS. 1 to 5, and a detailed description of the components is omitted.

Figure 7:
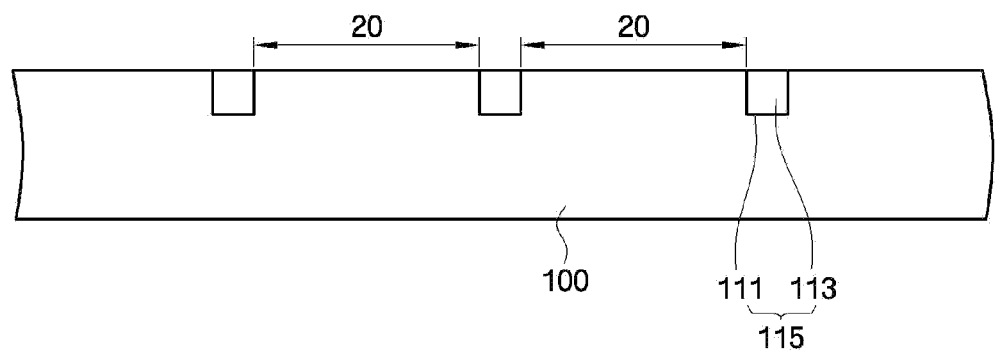
FIGS. 7 to 16B are cross-sectional views illustrating intermediate process steps for explaining a method for fabricating the nonvolatile memory device according to an exemplary embodiment.

First, referring to FIGS. 6 and 7, a structure 115 for forming a common source line is formed to extend along a first direction of the semiconductor substrate 100 (S1010). In one embodiment, the structure 115 (which may be referred to as a first structure) includes a trench 111 extending along the first direction, and a sacrificial pattern 113 formed in the trench 111.

In one embodiment, to form the trench 111, a photoresist pattern (not shown) is formed on the semiconductor substrate 100. Subsequently, a layer for forming the sacrificial pattern 113 may be formed on the entire surface of the semiconductor substrate 100 having the trench 111 using, for example, silicon nitride ($SiN_x$), by a chemical vapor deposition (CVD) process, and the layer for forming the sacrificial pattern 113 is etched back to expose a top surface of the semiconductor substrate 100, thereby forming the sacrificial pattern 113 in the trench 111.

As the result of forming the structure 115 for forming the common source line, a region between the structures 115 is defined as a memory cell string region 20. Therefore, in one embodiment, a structure 115 for forming the common source line is positioned at a first side and a second, opposite side of the memory cell string region 20.

Figure 8:
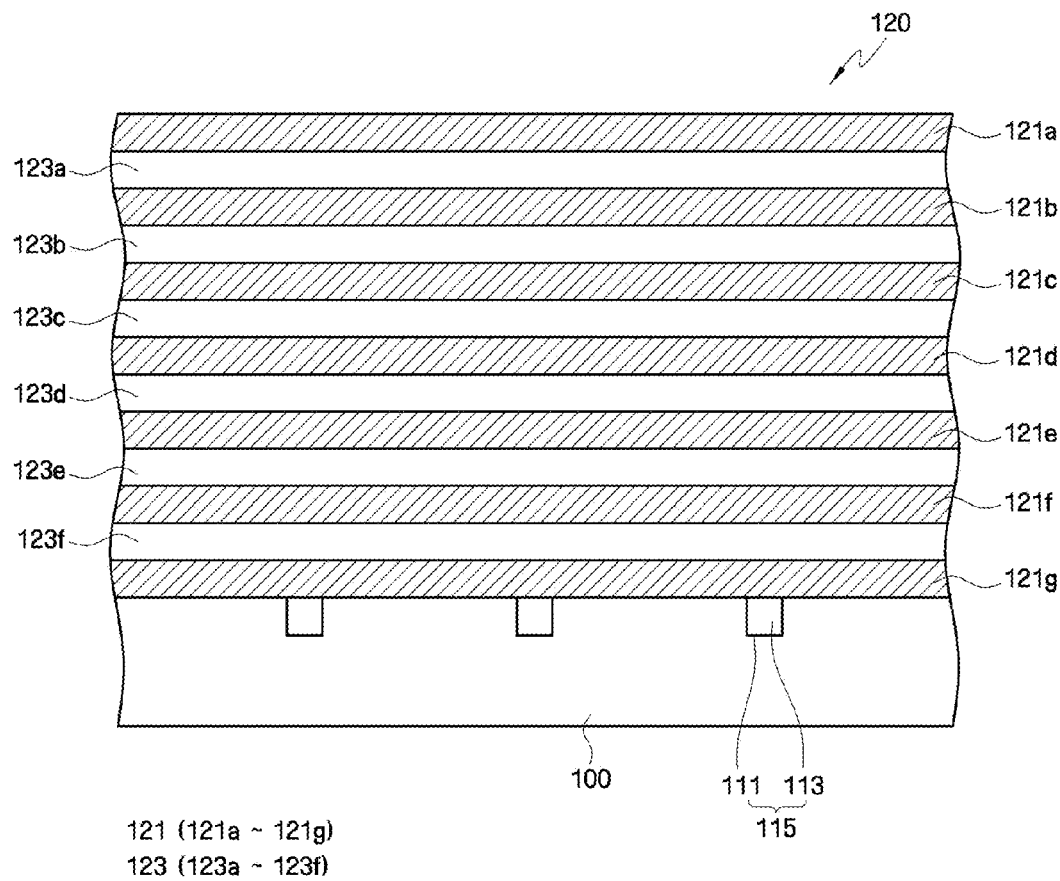

Next, referring to FIGS. 6 and 8, a plurality of sacrificial layers 123 and a plurality of insulating layers 121 are alternately stacked on the resultant first structure shown in FIG. 7 to form a mold structure 120 (S1020).

Since the gate electrodes 142a-142f are formed at regions from which the sacrificial layers 123 are removed, stack numbers of the sacrificial layers 123 and the insulating layers 121 may be equal to or greater than the number of cell transistors included in the memory cell string 31. For example, if n cell transistors are connected in series to each other in the memory cell string 31, 1 to (n+1) sacrificial layers 123 and 1 to (n+1) insulating layers 121 may be alternately stacked one on top of the other. In one embodiment, as illustrated in FIG. 5, since 6 cell transistors are connected to one memory cell string 31, first to sixth sacrificial layers 123a-123f and first to seventh insulating layers 121a-121g may be alternately stacked one on top of the other.

In certain embodiments, the sacrificial layers 123 and the insulating layers 121 may be made of materials having different etching selectivities. In one embodiment, the etching selectivities of the sacrificial layers 123 to the insulating layers 121 may be, for example, 10:1, but they are not limited thereto as long as they may be within a range of etching selectivity allowing the insulating layers 121 to remain even when the sacrificial layers 123 are removed in a subsequent process. The sacrificial layers 123 may be made of, for example, silicon nitride ($SiN_x$), and the insulating layers 121 may be made of, for example, silicon oxide ($SiO_x$), or vice versa. In one embodiment, the mold structure 120 may be formed by alternately depositing silicon nitride ($SiN_x$) and silicon oxide ($SiO_x$) on the semiconductor substrate 100 by a chemical vapor deposition (CVD) process.

Although the sacrificial layers 123 have the same thickness in the drawings of the illustrated embodiments, they may have different thicknesses. For example, the sacrificial layers 123a-123f are removed in a subsequent process and the gate electrodes 142a-142f are formed at regions from which the sacrificial layers 123a-123f are removed. In some situations, it may be useful or necessary to vary a channel length according to characteristic requirements of cell transistors. Accordingly, thicknesses of the removed regions of the sacrificial layers 123a-123f can be adjusted by adjusting thicknesses of the sacrificial layers 123a-123f. In addition, the thicknesses of the gate electrodes 142a-142f of the cell transistors formed at the regions can also be adjusted. Therefore, it is possible to vary channel lengths of the respective cell transistors.

In one embodiment, the sacrificial layers 123 of the mold structure 120 and the sacrificial pattern 113 of the structure 115 for forming the common source line may be made of the same material or different materials having the same etching selectivity. Accordingly, in certain embodiments, the sacrificial pattern 113 is also removed at the same time that the sacrificial layers 123 are removed.

Figure 9:
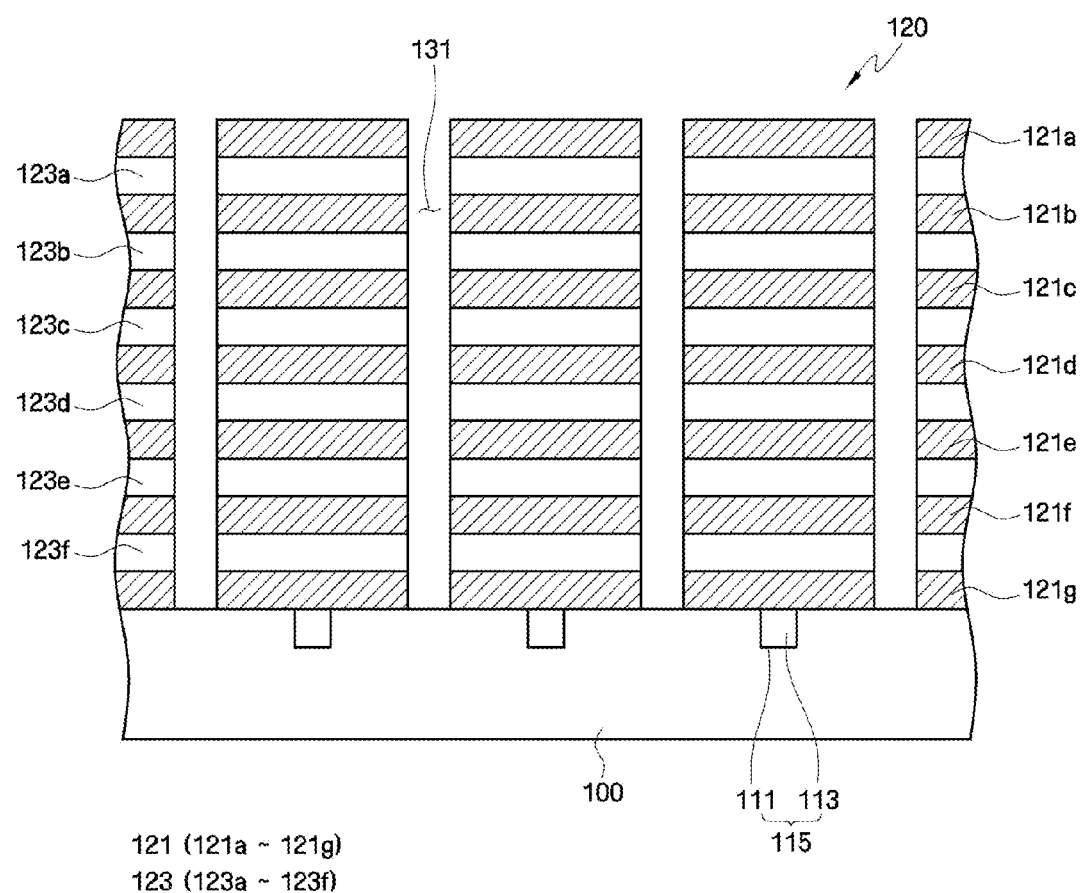

Referring to FIG. 9, a hole 131 for forming semiconductor patterns is formed on the resultant structure shown in FIG. 8. The hole 131 may be formed to penetrate the mold structure 120 including the insulating layers 121 and the sacrificial layers 123. In addition, the hole 131 may be formed to be positioned between structures 115 for forming common source lines. FIG. 9 illustrates one hole 131 is formed between the common source line forming structures 115. However, in a case where a plurality of semiconductor patterns 132 are formed between the common source line forming structures 115, a plurality of holes 131 may be formed between the common source line forming structures 115. The holes 131 may be formed in an array structure, when viewed from the top above the mold structure 120, as can be seen, for example, in FIG. 11C.

Figure 10:
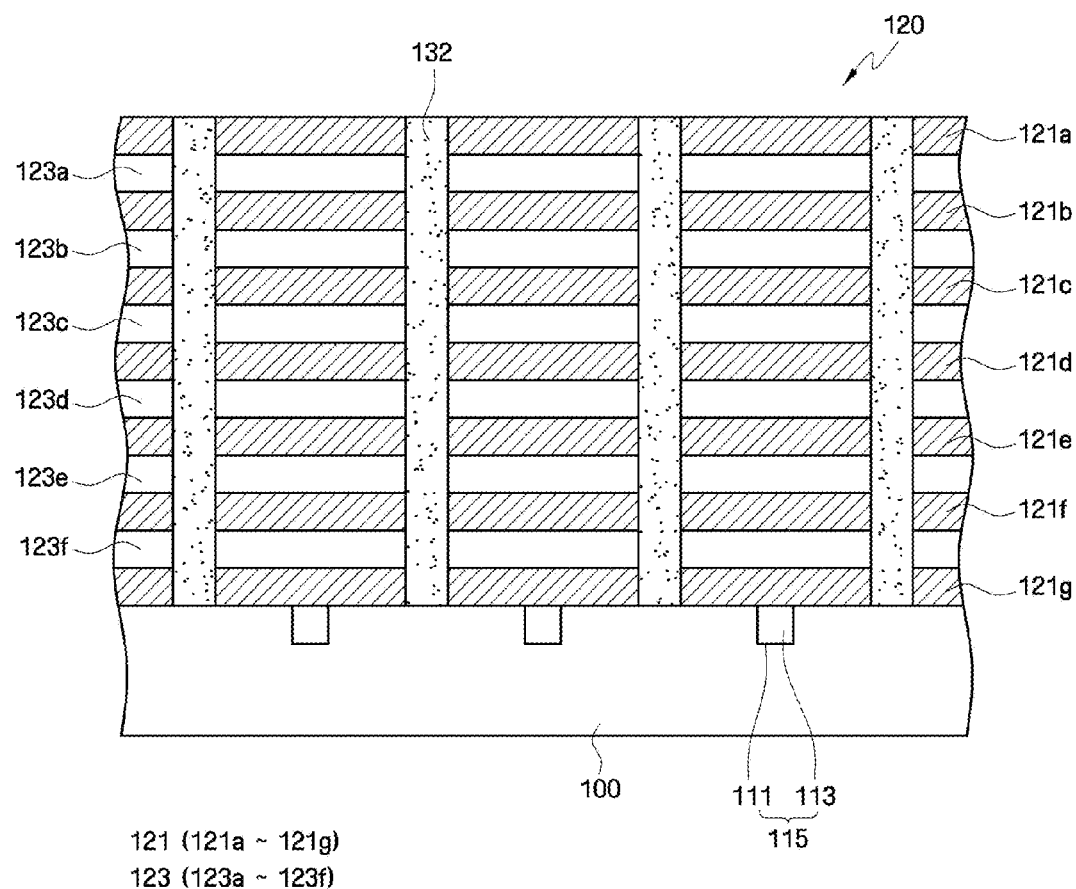

Next, referring to FIG. 10, semiconductor patterns 132 are formed in the hole 131 shown in FIG. 9. The semiconductor patterns 132 may be formed in shapes of pillars extending perpendicular to the semiconductor substrate 100. The semiconductor patterns 132 may be made of, for example, single crystalline silicon. The semiconductor patterns 132 may be formed by forming amorphous silicon and heating the amorphous silicon to change the phase of the amorphous silicon into single crystal silicon. Alternatively, the semiconductor patterns 132 may be formed by performing epitaxial growth on the semiconductor substrate 100 as a seed. In order to expose a top surface of the mold structure 120, if necessary, a chemical mechanical polishing (CMP) process may further be performed in a subsequent process.

As such, the holes 131 are filled with semiconductor substance to form the semiconductor patterns 132 extending perpendicular to the semiconductor substrate 100 and extending vertically through the mold structure 120.

Figure 11A:
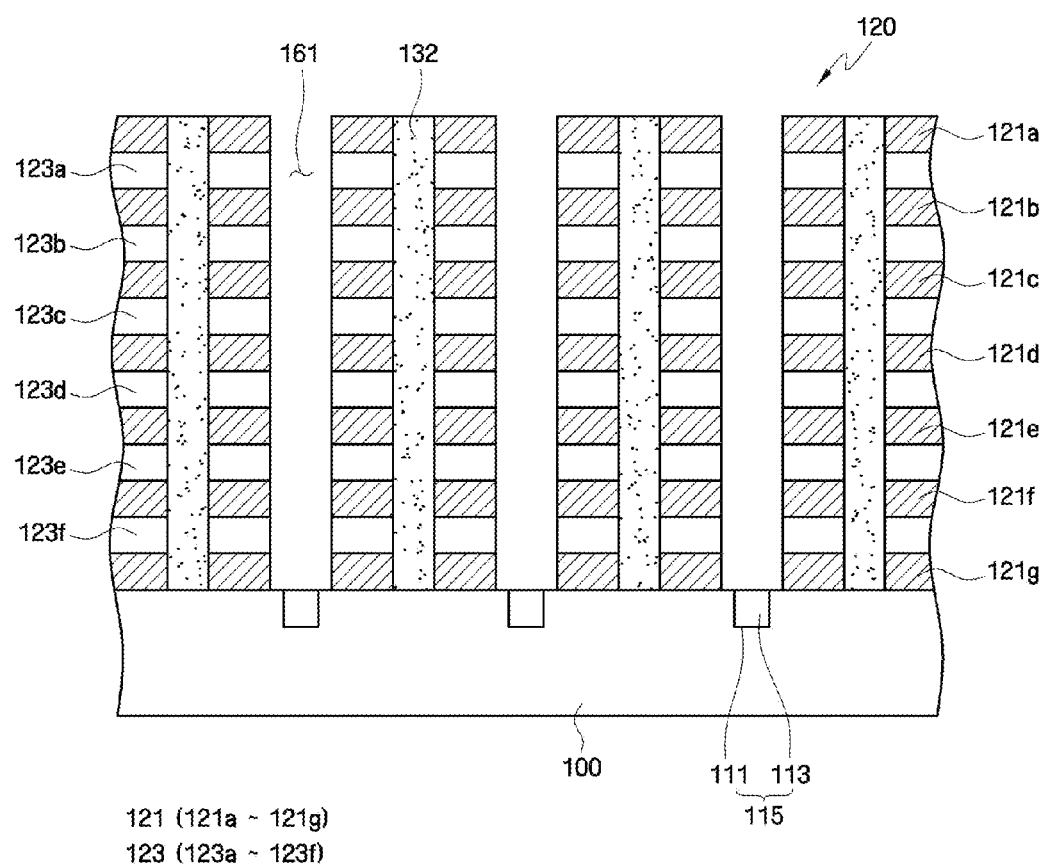
Figure 11B:
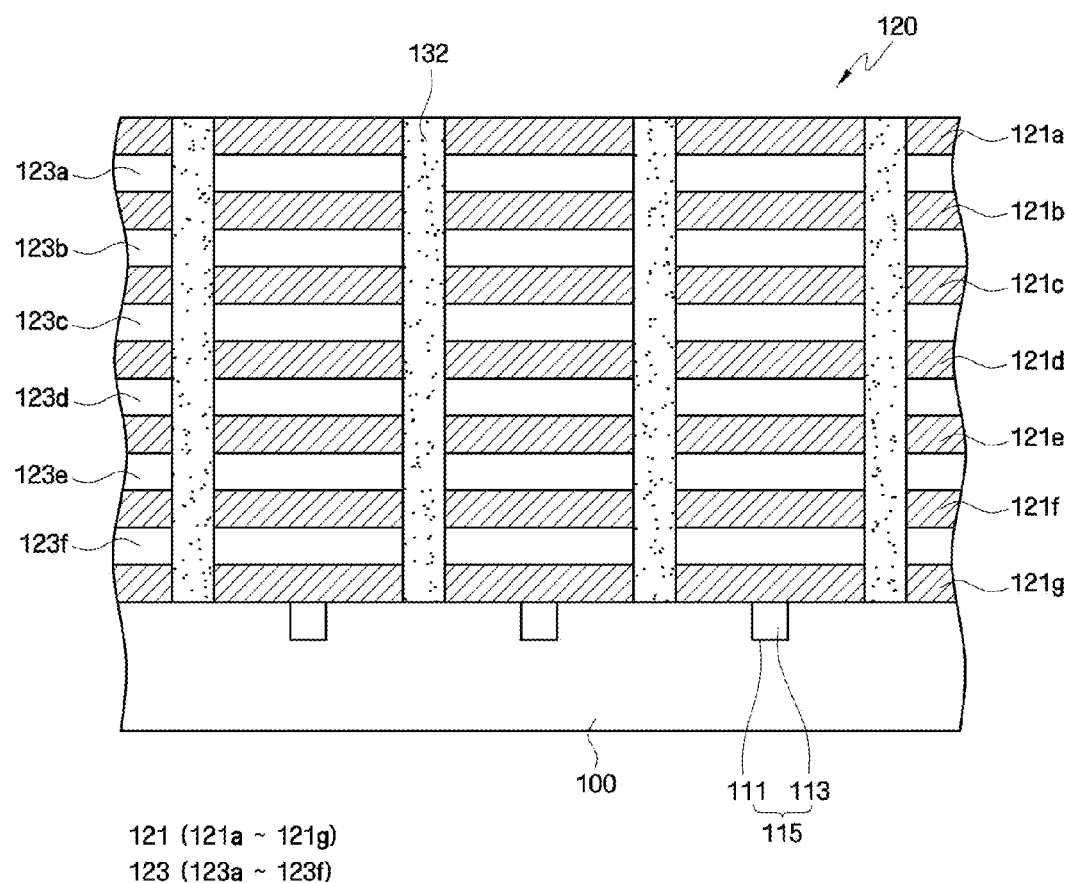
Figure 11C:
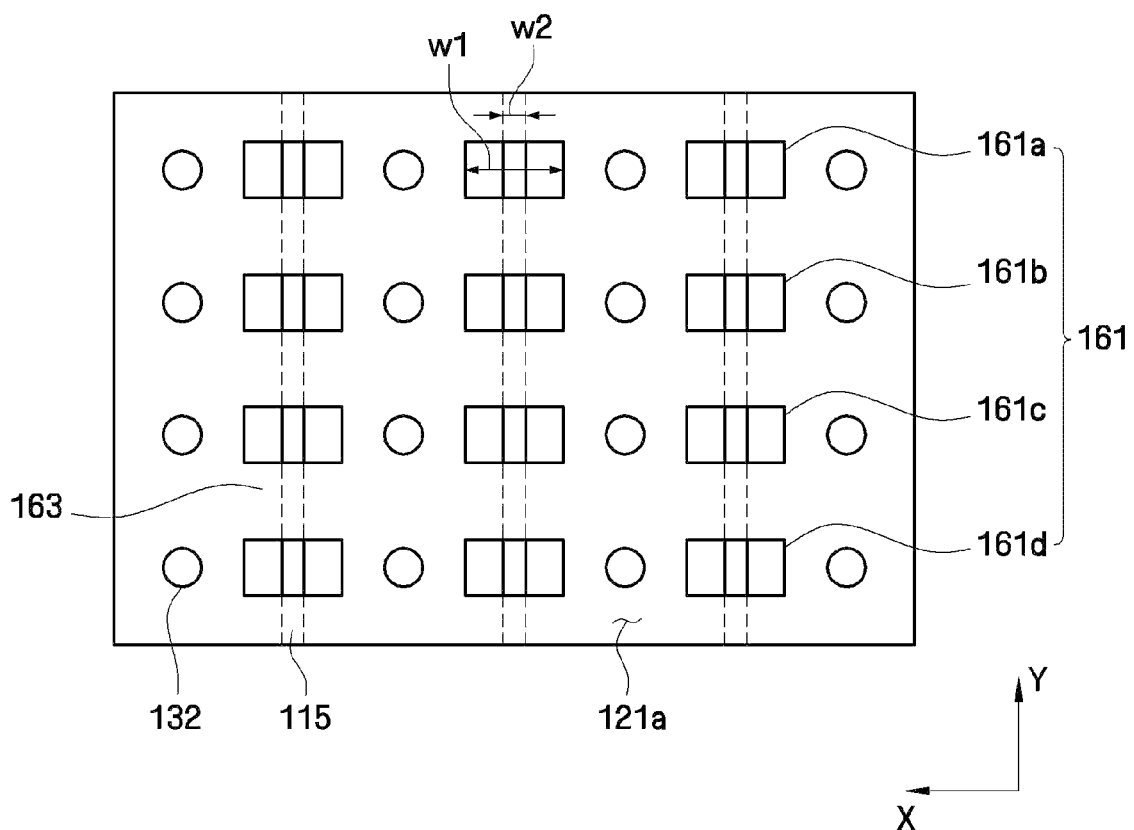

Referring to FIGS. 11A to 11C, in one embodiment, after forming the semiconductor patterns 132, an opening 161 (or a plurality of openings distributed in a direction perpendicular to the first direction in which the common source line forming structures 115 are formed) is formed on the resultant structure shown in FIG. 10 (S1030). Here, FIG. 11A represents the cross section taken along the line I-I' of FIG. 2 in the fabricating process, FIG. 11B represents the cross section taken along the line II-IF of FIG. 2 in the fabricating process, and FIG. 11C represents the plan view of the nonvolatile memory device being in the fabricating process. In the following specification and the drawings, the cross section taken along the line I-I' of FIG. 2 in the fabricating process will be denoted by reference numeral with 'a' and the cross section taken along the line II-II' of FIG. 2 in the fabricating process will be denoted by reference numeral with 'b' for brevity.

In one embodiment, the opening 161 includes a plurality of through-holes, such as first to fourth through-holes 161a-161d. The first to fourth through-holes 161a-161d may be arranged consecutively in the first direction and may each vertically penetrate portions of the mold structure 120, and portions of the common source line forming structures 115 may be exposed to the outside by the first to fourth through-holes 161a-161d. The first to fourth through-holes 161a-161d may be arranged at regular intervals in the first direction (i.e., Y-axis) in which the common source line forming structures 115 extend. In addition, the first to fourth through-holes 161a-161d are positioned to be aligned with and adjacent to each other and overlap with the common source line forming structures 115. However, other arrangements may be implemented. In one embodiment, a width W1 of each of the first to fourth through-holes 161a-161d may be greater than a width W2 of the common source line forming structure 115. The first to fourth through-holes 161a-161d may be used as injection paths of etchant for removing the sacrificial layers 123a-123f in a subsequent process. Thus, the first to fourth through-holes 161a-161d may be relatively wider than the common source line forming structure 115.

Regions where the first to fourth through-holes 161a-161d are not formed may function as a connecting portion 163 connecting the first to fourth through-holes 161a-161d to one another. As shown in FIG. 11C, the respective insulating layers 121a-121g may be formed to have, for example, a net structure. Accordingly, the insulating layers 121a-121g include the first to fourth through-holes 161a-161d and the connecting portion 163, thereby secure relatively enhanced mechanical strength during the manufacturing process, compared to an insulating layer including a continuously formed trench without a connecting portion. In addition, even if the stack height of cell transistors included in the memory cell string 31 increases, it is possible to prevent the memory cell string 31 from being bent or broken. Therefore, according to one embodiment, even when the stack height of the cell transistors is increased, integration of memory cells can be advantageously achieved.

The sacrificial layers 123a-123f positioned below the insulating layers 121a-121g may also have a net structure including the first to fourth through-holes 161a-161d and the connecting portion 163.

Figure 12A:
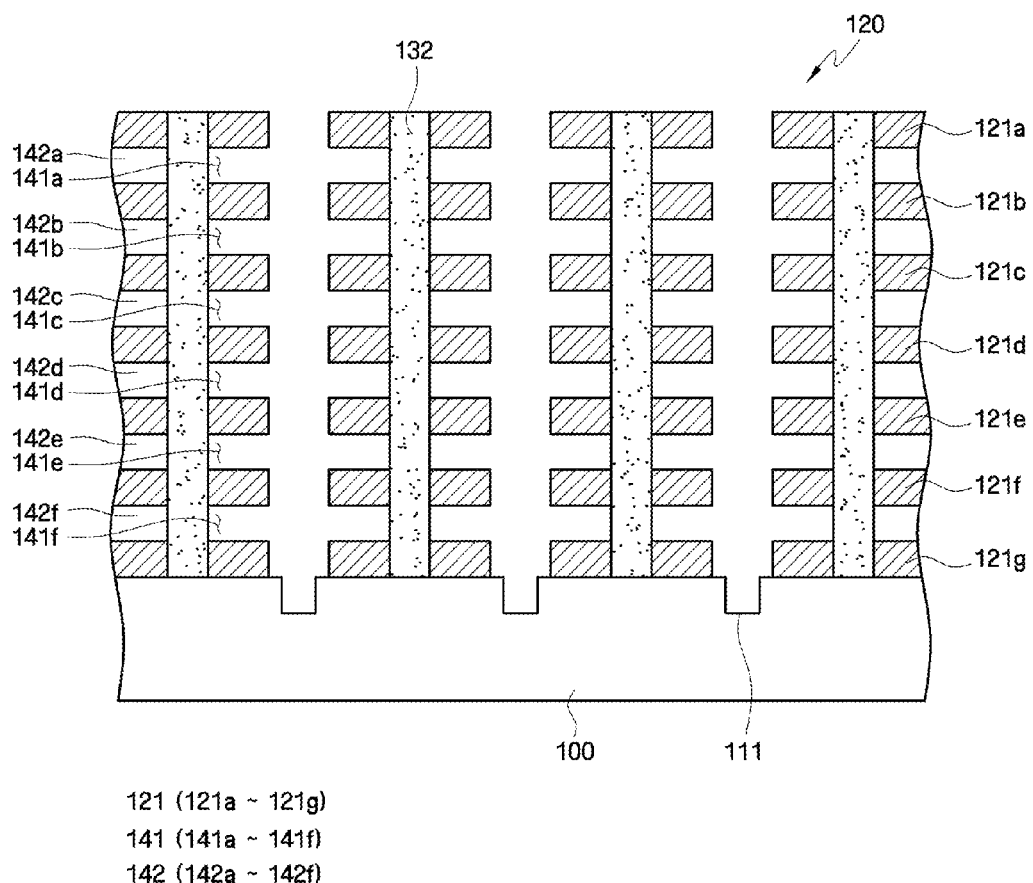
Figure 12B:
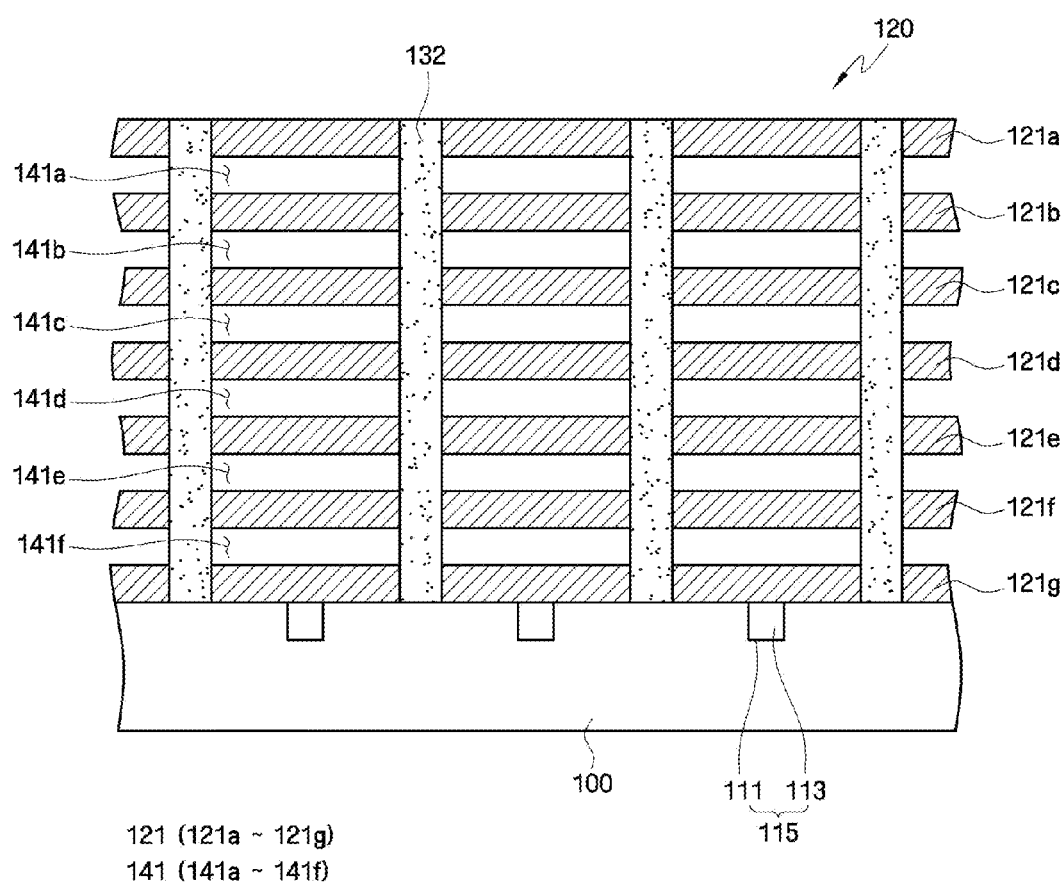

Next, referring to FIGS. 12A and 12B, the sacrificial layers 123a-123f are selectively removed from the mold structure 120 to form a groove group 141 including a plurality of grooves, or recesses 141a-141f positioned between the insulating layers 121a-121g. Additionally, the sacrificial pattern 113 included in the common source line forming structure 115 may also be removed at the same time that the sacrificial layers 123a-123f are removed, which may be achieved when the sacrificial layers 123a-123f and the sacrificial pattern 113 are made of the same material or a different materials having the same etching selectivity.

In one embodiment, in order to remove the sacrificial layers 123a-123f and the sacrificial pattern 113, etchant is injected into the opening 161 (or a plurality of openings). The etchant may include, for example, phosphoric acid. As the result of removing the sacrificial pattern 113, the trench 111 may be exposed to the outside by the opening 161.

Figure 13A:
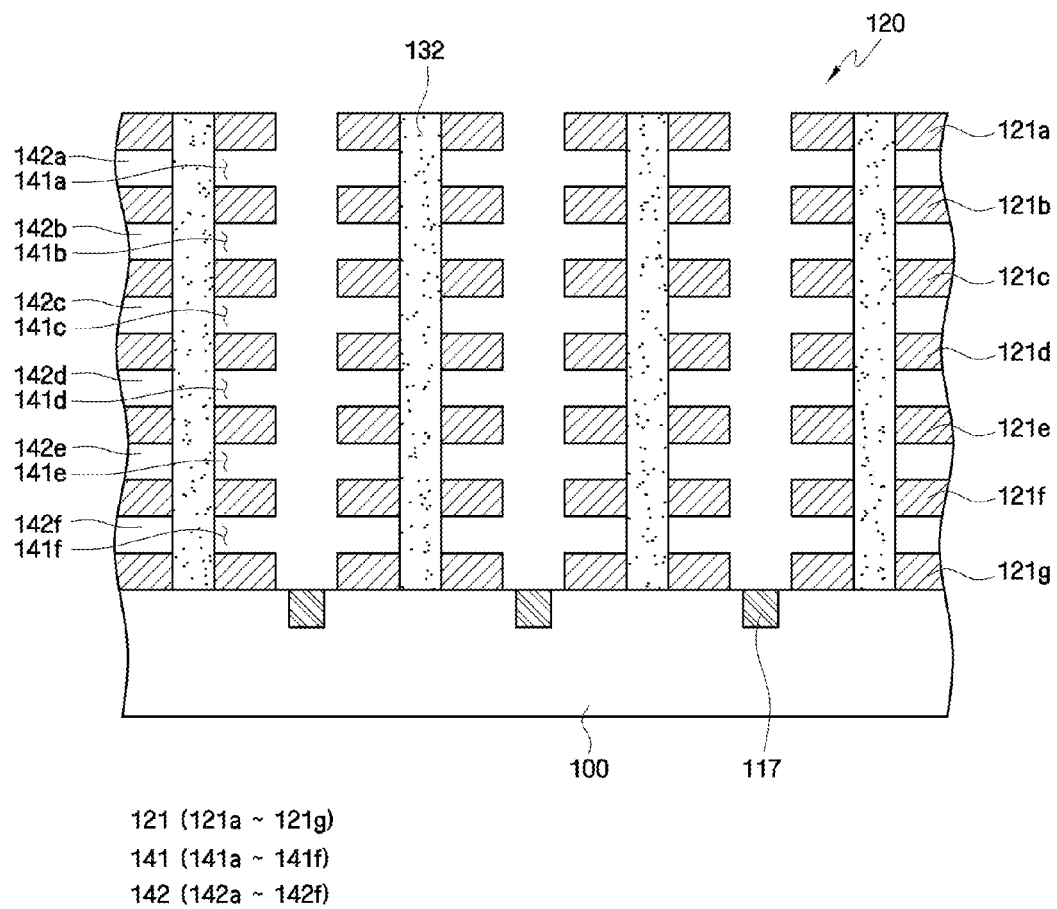
Figure 13B:
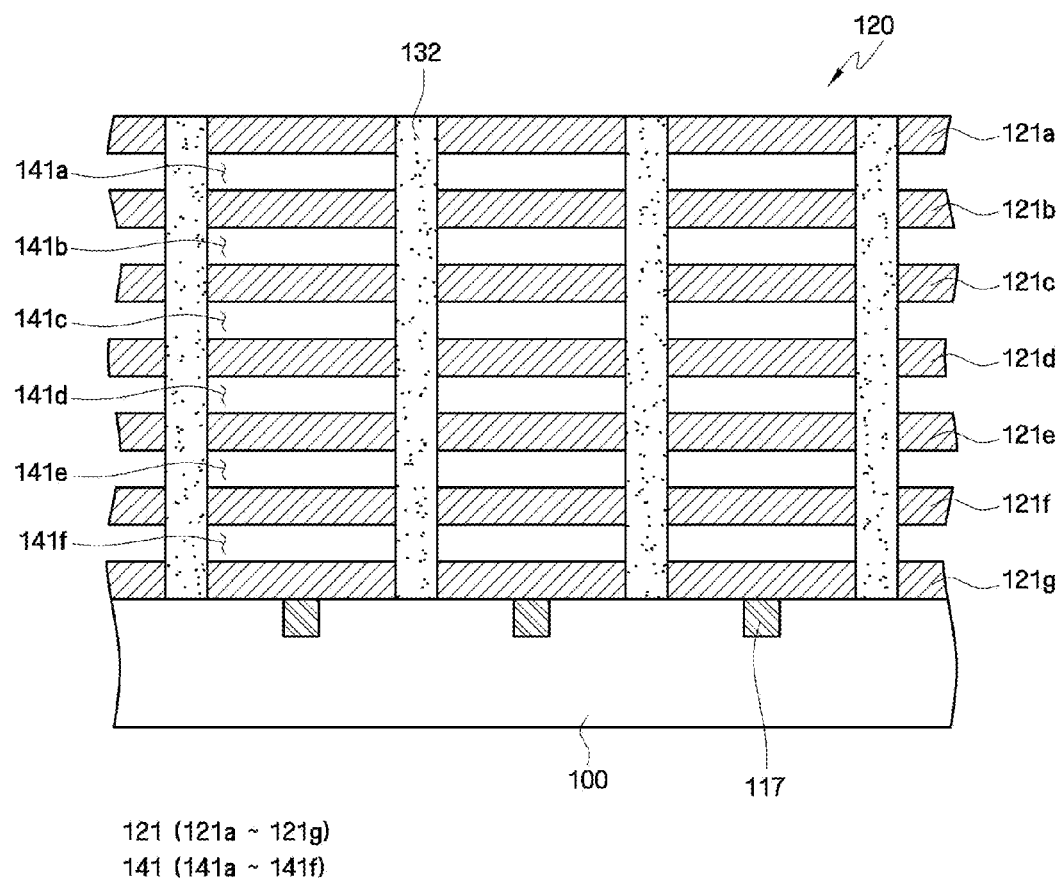

Next, referring to FIGS. 6, 13A and 13B, the common source line 117 is formed (S1040).

To this end, a conductive pattern (not shown) is first formed to fill the trench 111. The conductive pattern may be formed, for example, by CVD or ALD using cobalt (Co). In addition, silicidation may be performed on the conductive pattern under a silicon (Si) gas atmosphere to form the common source line 117. As a result, a first common source line 117 positioned at a first side of a memory cell string forming region (see 20 of FIG. 7) and a second common source line 117 positioned at a second, opposite side of the memory cell string forming region 20 may be formed.

Figure 14A:
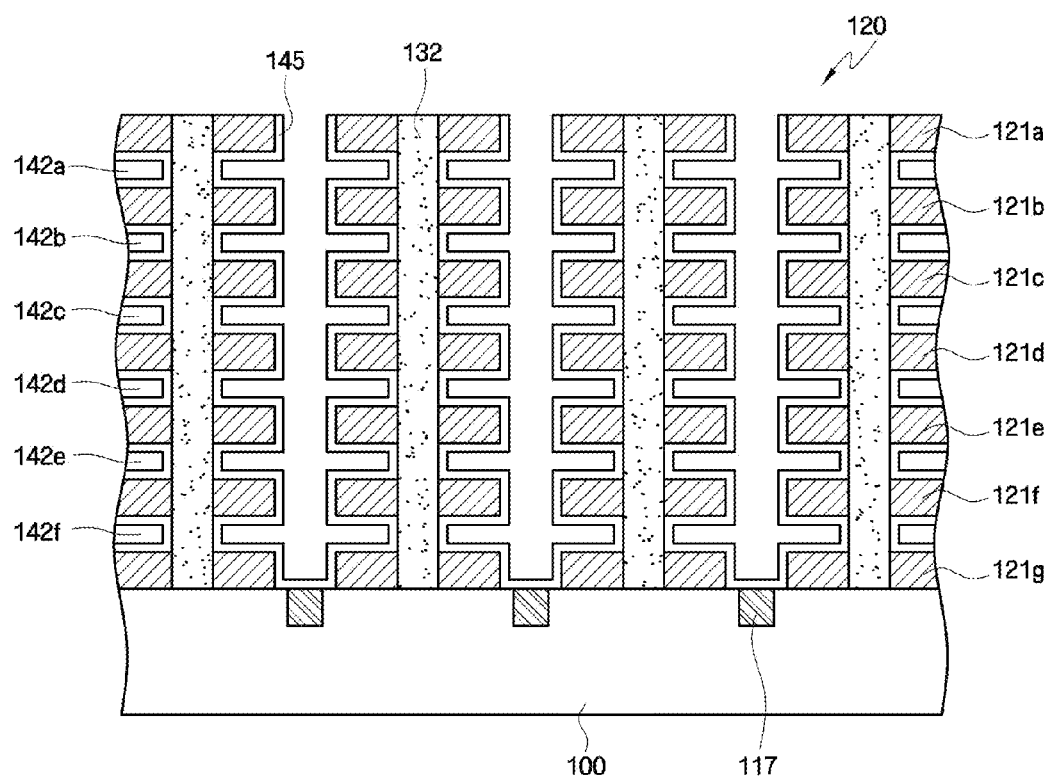
Figure 14B:
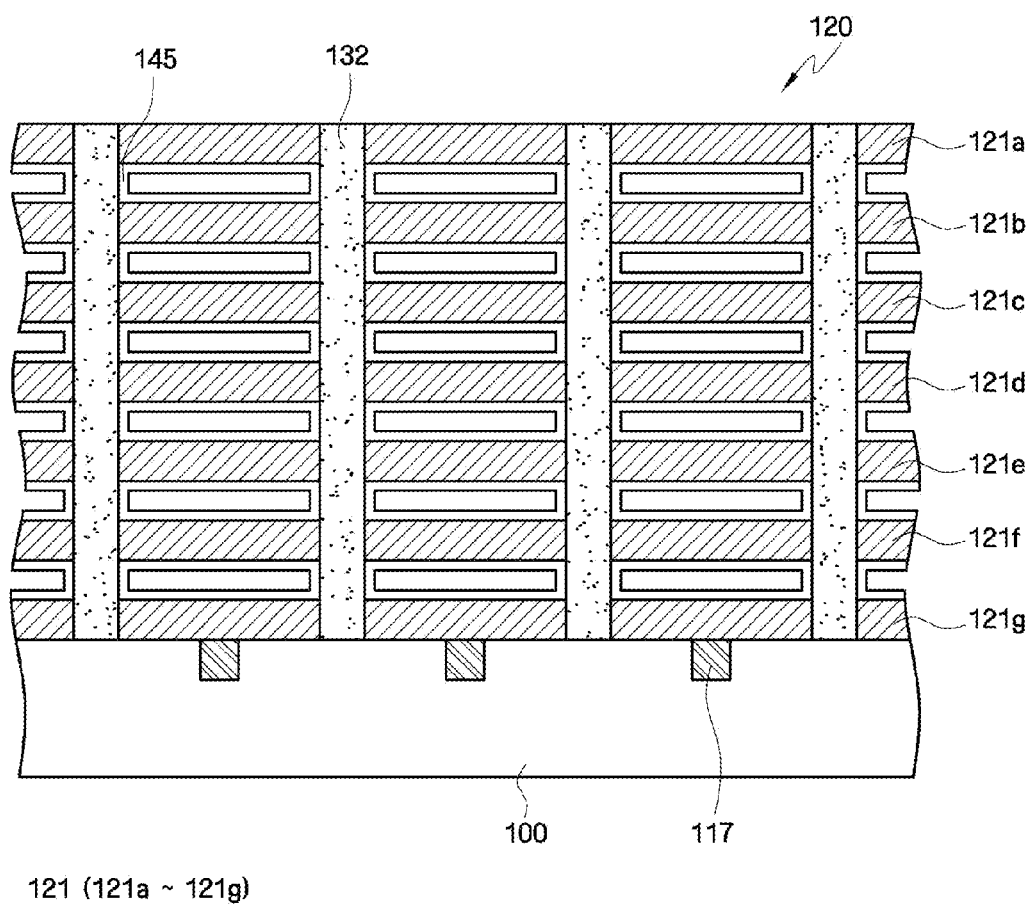

Referring to FIGS. 14A and 14B, a charge storage layer forming layer 145 is formed on the resultant structure shown in FIGS. 13A and 13B.

The charge storage layer forming layer 145 may be conformally formed on the entire surface of the plurality of grooves 141a-141f and the insulating layers 121a-121g. The charge storage layer forming layer 145 may be formed of, for example, an ONA layer. To this end, the charge storage layer forming layer 145 may be formed by sequentially stacking silicon oxide, silicon nitride and alumina by CVD or ALD.

Next, portions of the charge storage layer forming layer 145, the portions excluding contact portions between the charge storage layer forming layer 145 and the semiconductor patterns 132, are all removed to form the charge storage layers 144a-144f in the plurality of grooves 141a-141f.

Figure 15A:
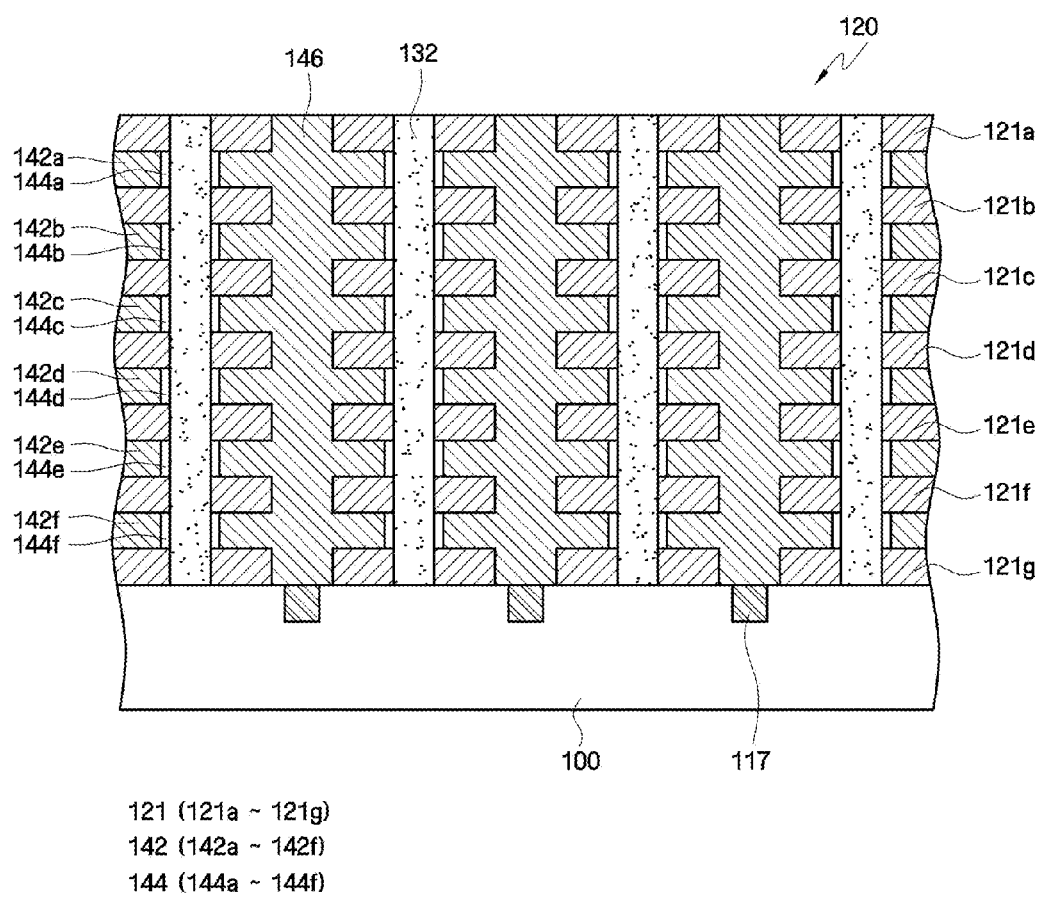
Figure 15B:
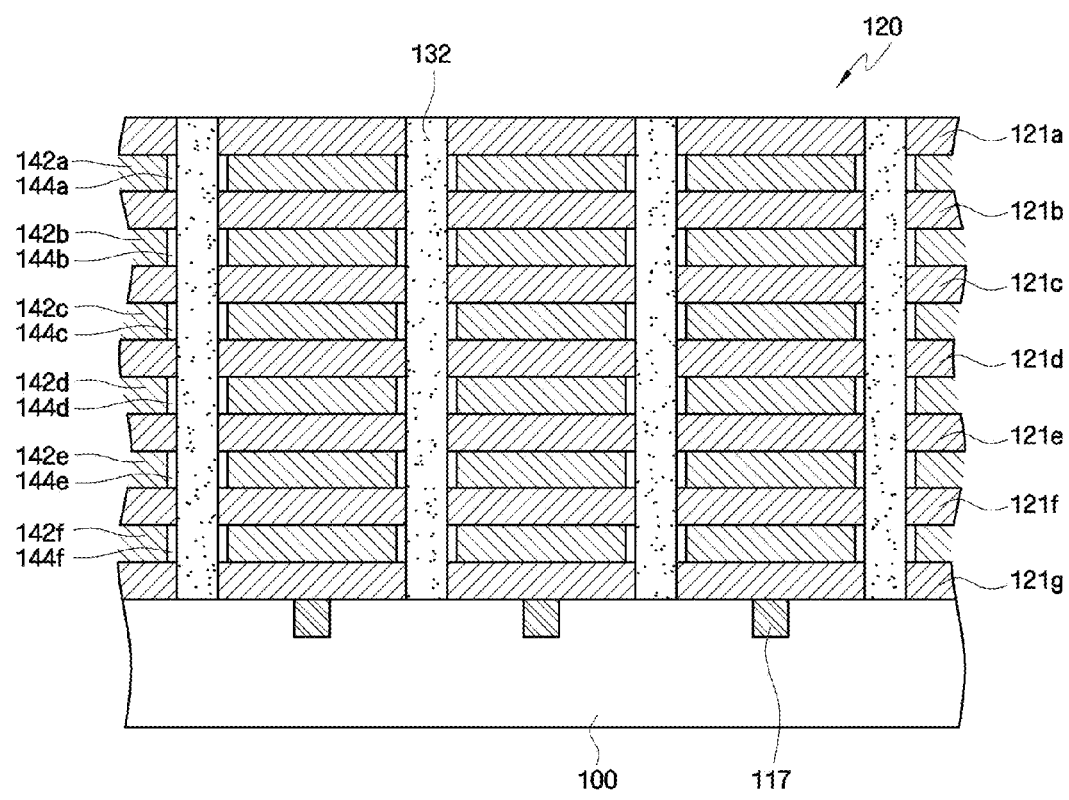

Referring to FIGS. 15A and 15B, the plurality of grooves 141a-141f having the charge storage layers 144a-144f are filled with a conductive material to form a conductive layer 146. In one embodiment, the conductive layer 146 may be formed by CVD or ALD using, for example, tungsten (W). The conductive material may also fill in the through-holes 161a-161d and/or other through-holes.

Figure 16A:
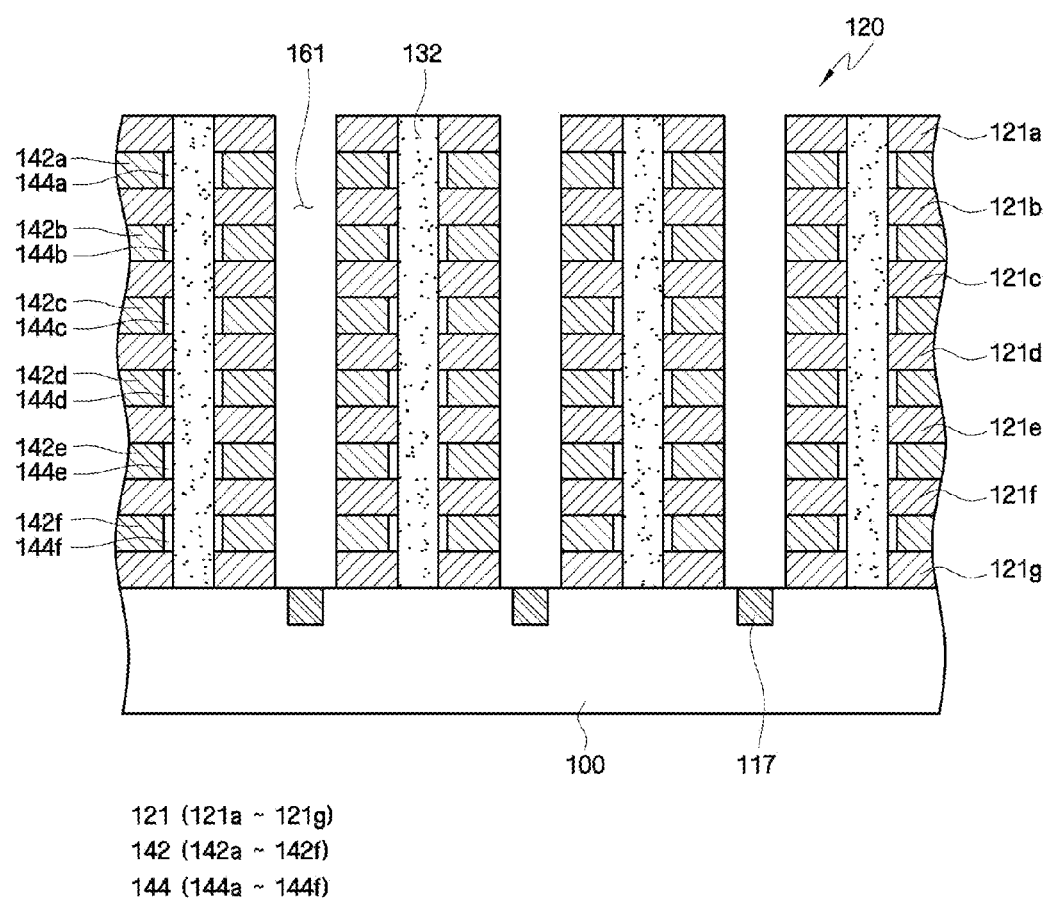
Figure 16B:
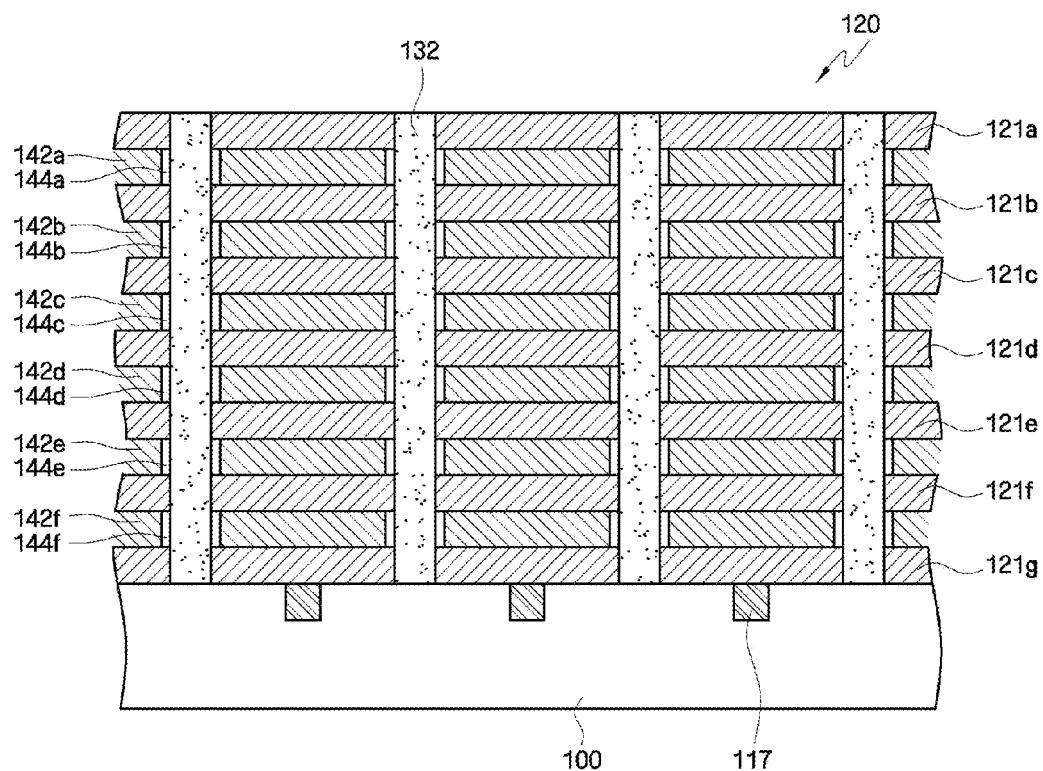

Referring to FIGS. 16A and 16B, a gate group 142 including the plurality of gate electrodes 142a-142f is formed by removing the portions of the conductive layer 146 excluding portions of the conductive layer 146 positioned in the grooves 141a-141f (e.g., by removing the conductive material remaining in the through-holes 161a-161d and/or other through-holes). In one embodiment, the holes remaining after the portion of the conductive layer is removed may be filled with an insulating material.

Accordingly, a memory cell string 31 is formed in a memory cell forming region 20 (S1050). More specifically, in the memory cell forming region 20, a first memory cell string may be formed at a first side of the common source line 117 and a second memory cell string may be formed at a second, opposite side of the common source line 117.

The plurality of gate electrodes 142a-142f may have horizontal plate shapes. Accordingly, a gate electrode included in at least one of the memory cell strings and another gate electrode included in the other memory cell string may be electrically connected to each other.

In one embodiment, referring to FIG. 4, an opening is formed by removing portions of the insulating layers 121a positioned on the upper select gate 142a included in the respective memory cell strings. As the result, a portion of the upper select gate 142a is exposed. Thereafter, the portion of the upper select gate 142a exposed by the opening is removed. Accordingly, the respective upper select gates 142a included in the respective memory cell strings are electrically insulated from one another. For example, the upper select gate 142a included in at least one memory cell string and the other upper select gate 142a included in the other memory cell string spaced apart from the at least one memory cell string may be electrically insulated from one another. Then, the space 172 formed by removing a portion of the upper select gate 142a and including the opening may be filled with an insulating material.

Referring to FIG. 1, the bit lines 70 connected to the semiconductor patterns 132 are then formed, thereby forming the nonvolatile memory device 1.

Next, a method for fabricating a nonvolatile memory device according to another exemplary embodiment will be described with reference to FIG. 17. For convenience of description, the same reference numerals are used to designate components substantially identical to those of the previous embodiment, and a detailed description of the components is omitted.

Figure 17:
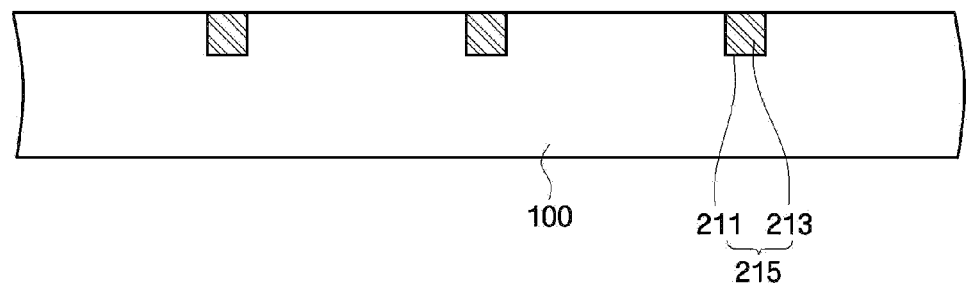
FIG. 17 illustrates a method for fabricating a nonvolatile memory device according to another exemplary embodiment.

In detail, referring to FIG. 17, a structure 215 for forming a common source line is formed to extend along a first direction of the semiconductor substrate 100 (S1010). The structure 215 according to the exemplary embodiment may include a trench 211 extending along the first direction, and a conductive pattern 213.

In addition, the processes shown in FIGS. 8 to 12B are performed, and silicidation is performed on the conductive pattern 213 under a silicon (Si) gas atmosphere to form the common source line 117, as shown in FIGS. 13A and 13B.

Next, the processes shown in FIGS. 1 to 4 and FIGS. 14A to 16B are performed, thereby forming the nonvolatile memory device according to the illustrated exemplary embodiment. As such, the common source line 117 may be formed prior to or separately from forming the mold structure 120 including the semiconductor patterns 132, insulating layers 121, control gates 144, charge storage layers 142, etc.

Figure 18:
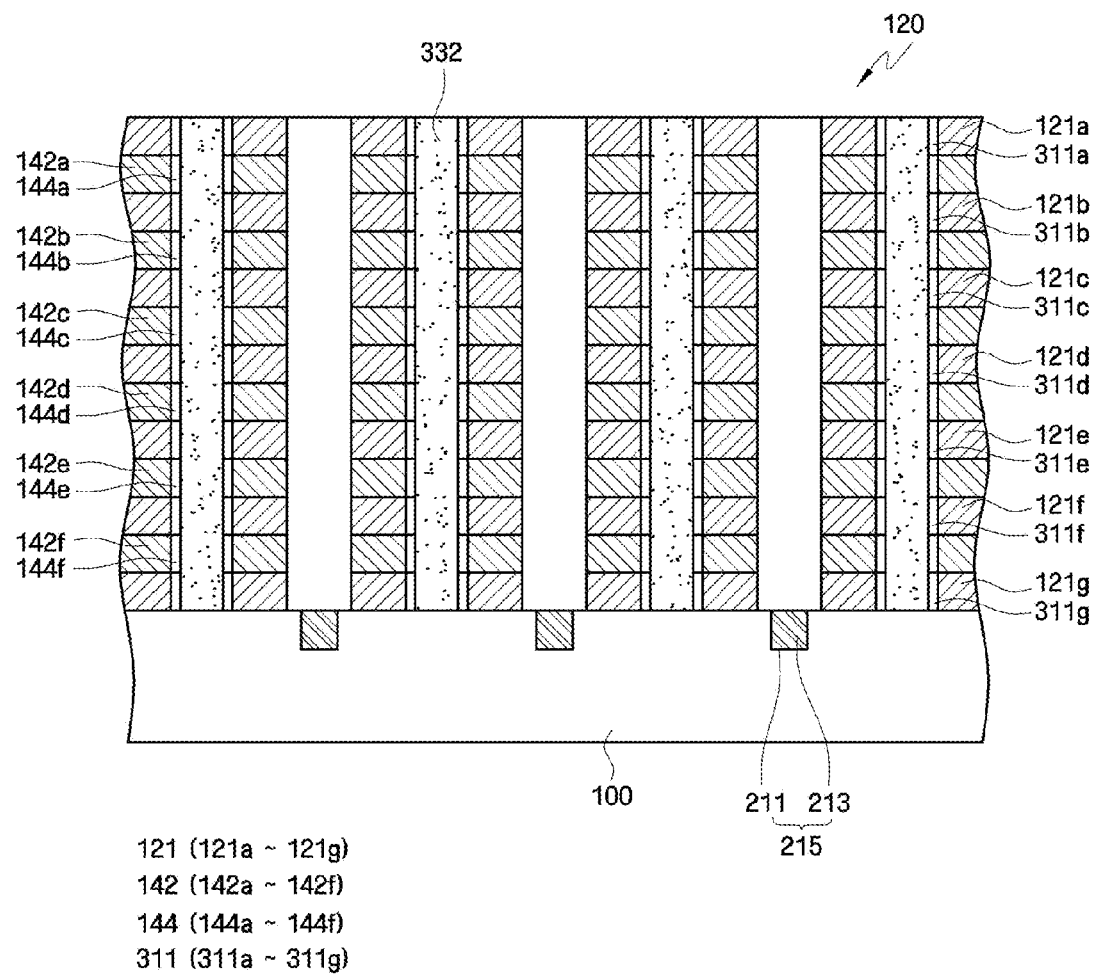
FIG. 18 is a cross-sectional view, taken along line I-I' of FIG. 2.
Figure 19:
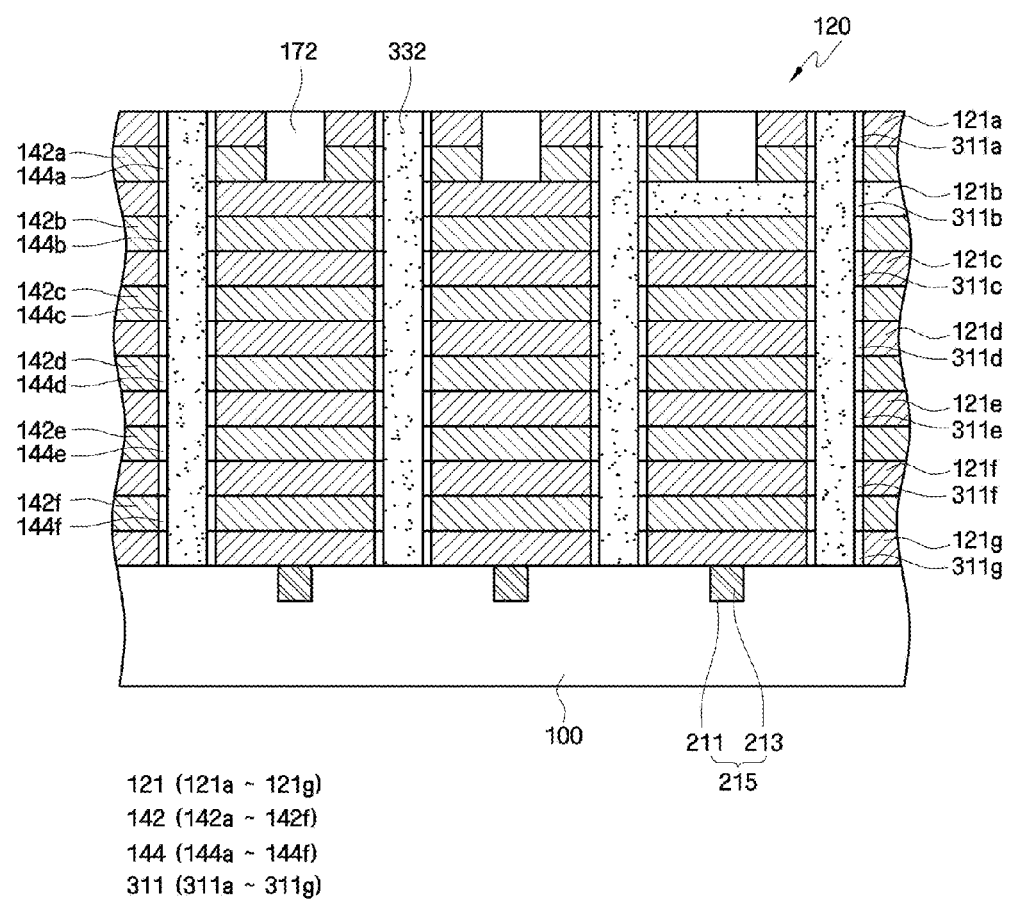
FIG. 19 is a is a cross-sectional view, taken along line II-II' of FIG. 2.

Next, a method for fabricating a nonvolatile memory device according to still another exemplary embodiment will be described with reference to FIGS. 2, 6, 9, and 18 to 24B. FIG. 18 is a cross-sectional view, taken along line I-I' of FIG. 2, FIG. 19 is a is a cross-sectional view, taken along line II-II' of FIG. 2, and FIGS. 20 to 24B are cross-sectional views illustrating intermediate process steps for explaining a method for fabricating the nonvolatile memory device according to another exemplary embodiment. For convenience of description, the same reference numerals are used to designate components substantially identical to those of the previous embodiment, and a detailed description of the components is omitted.

Referring to FIGS. 18 and 19, the nonvolatile memory device according to the illustrated exemplary embodiment is substantially the same as the nonvolatile memory device according to the previous exemplary embodiment shown in FIGS. 7 to 16B, except that insulating pattern layers 311a-311g are positioned between the insulating layers 121a-121g and the semiconductor patterns 332.

The insulating pattern layers 311a-311g are positioned at sidewalls of the semiconductor patterns 332, thereby preventing the semiconductor patterns 332 from being damaged, which may occur when forming the common source line 117. This will be described later.

Figure 20:
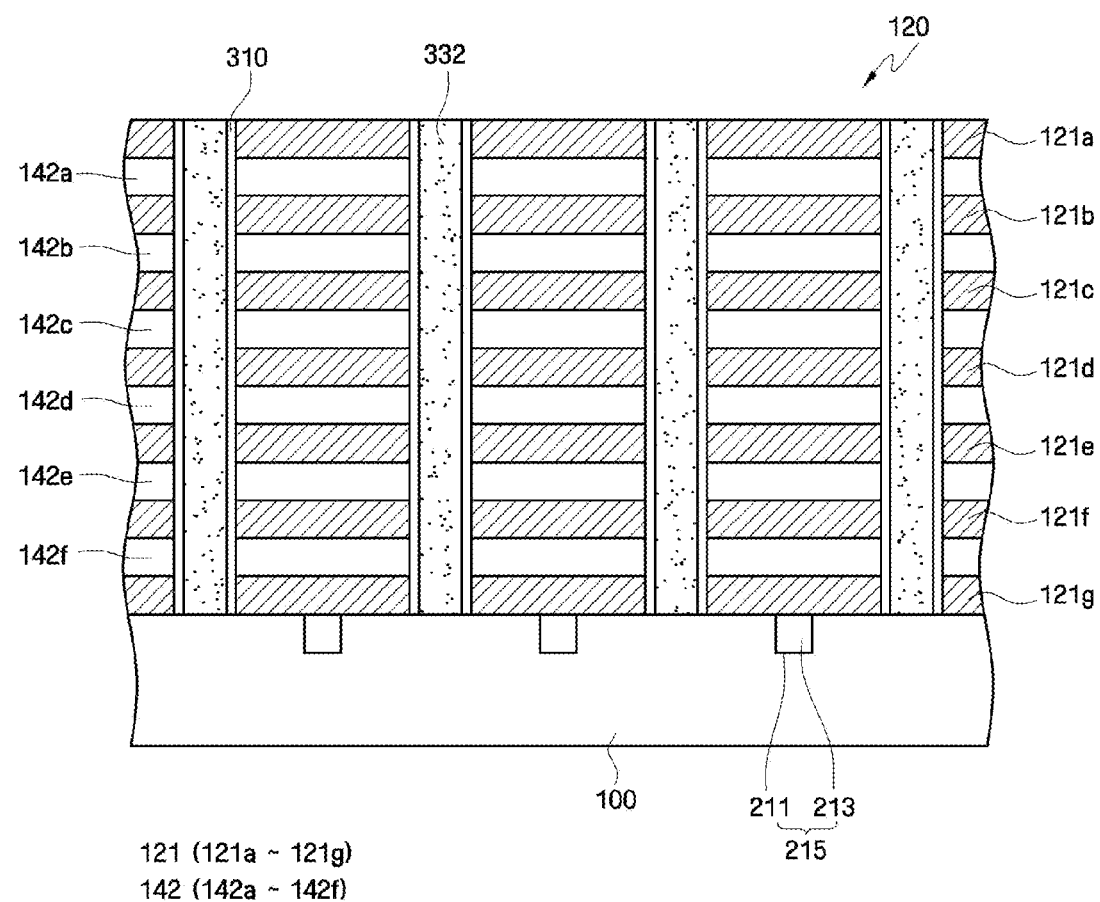
FIGS. 20 to 24B are cross-sectional views illustrating intermediate process steps for explaining a method for fabricating the nonvolatile memory device according to another exemplary embodiment.

Referring to FIG. 20, an insulating pattern 310 is formed in the semiconductor patterns forming hole 131 shown in FIG. 9. In detail, the insulating pattern 310 is formed on sidewalls of the hole 131. Here, the insulating pattern 310 may be made of a material having different etching selectivity from the sacrificial layers 123a-123f. More specifically, the insulating pattern 310 may be made of a material having etching selectivity in a range of between the etching selectivity of the sacrificial layers 123a-123f and the etching selectivity of the insulating layers 121a-121g.

Figure 21A:
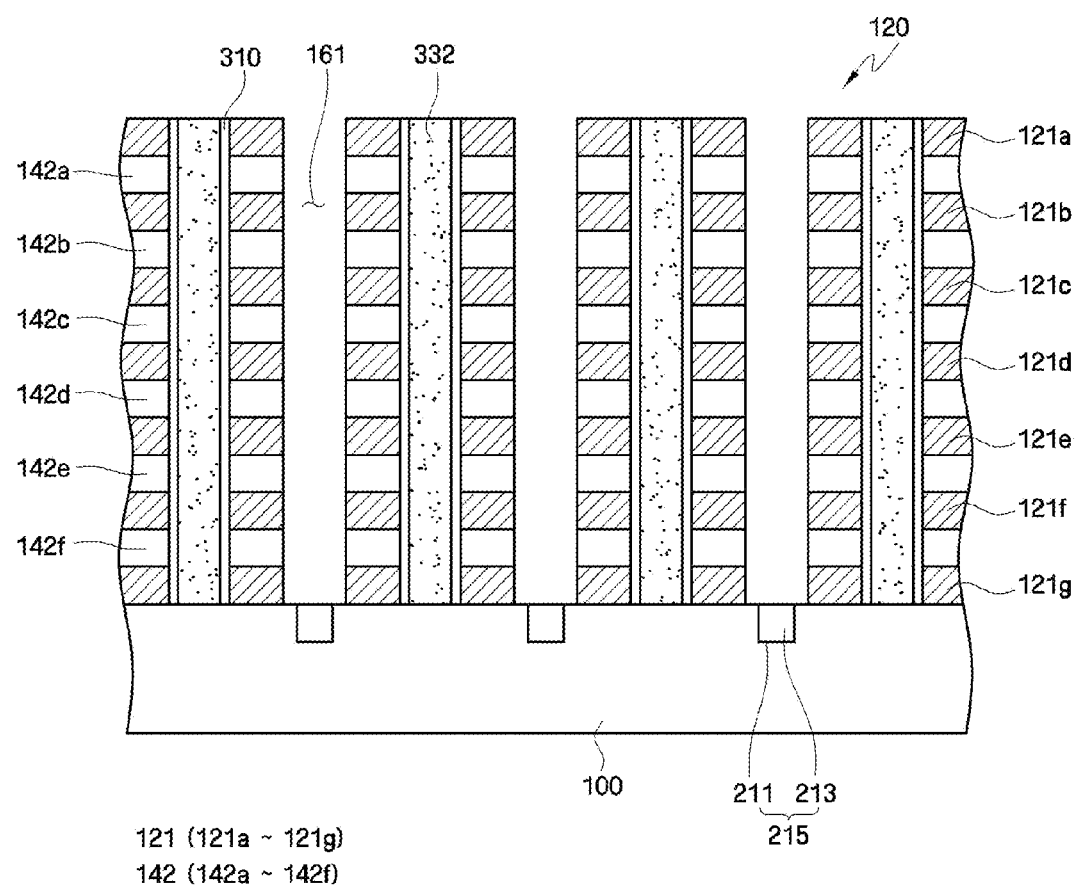
Figure 21B:
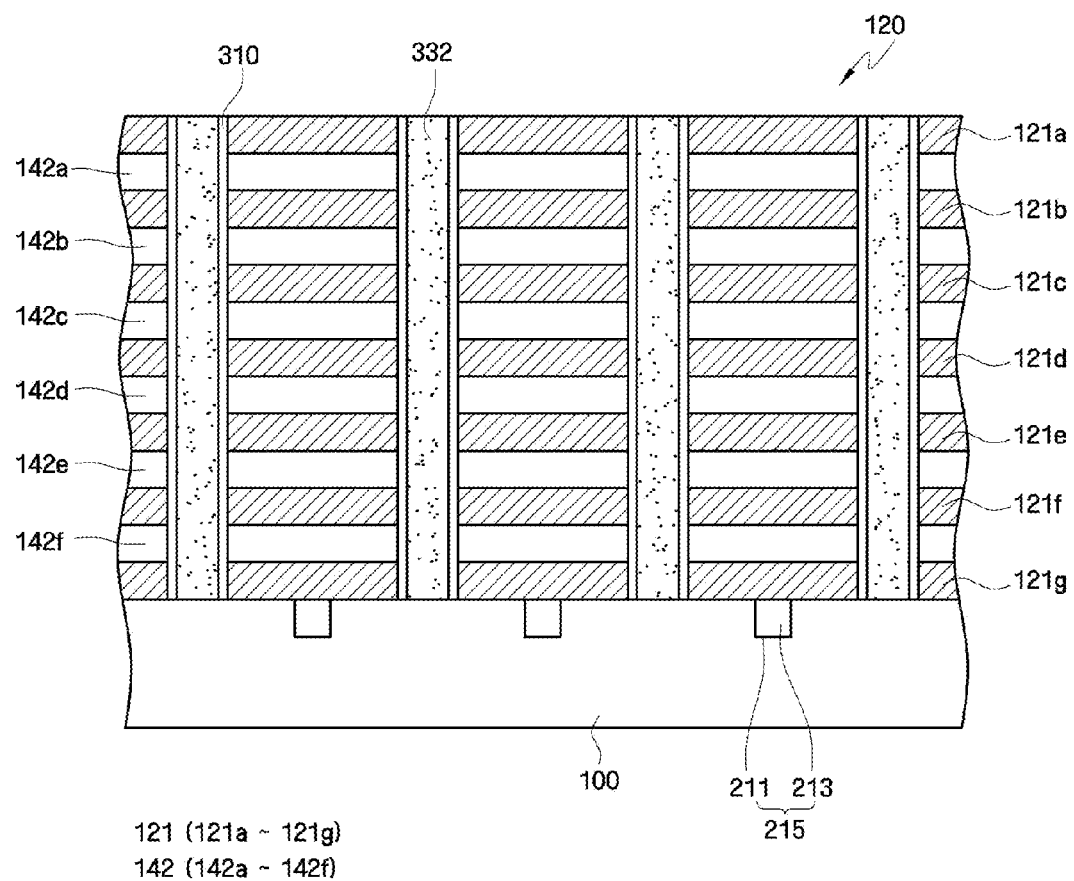
Figure 22A:
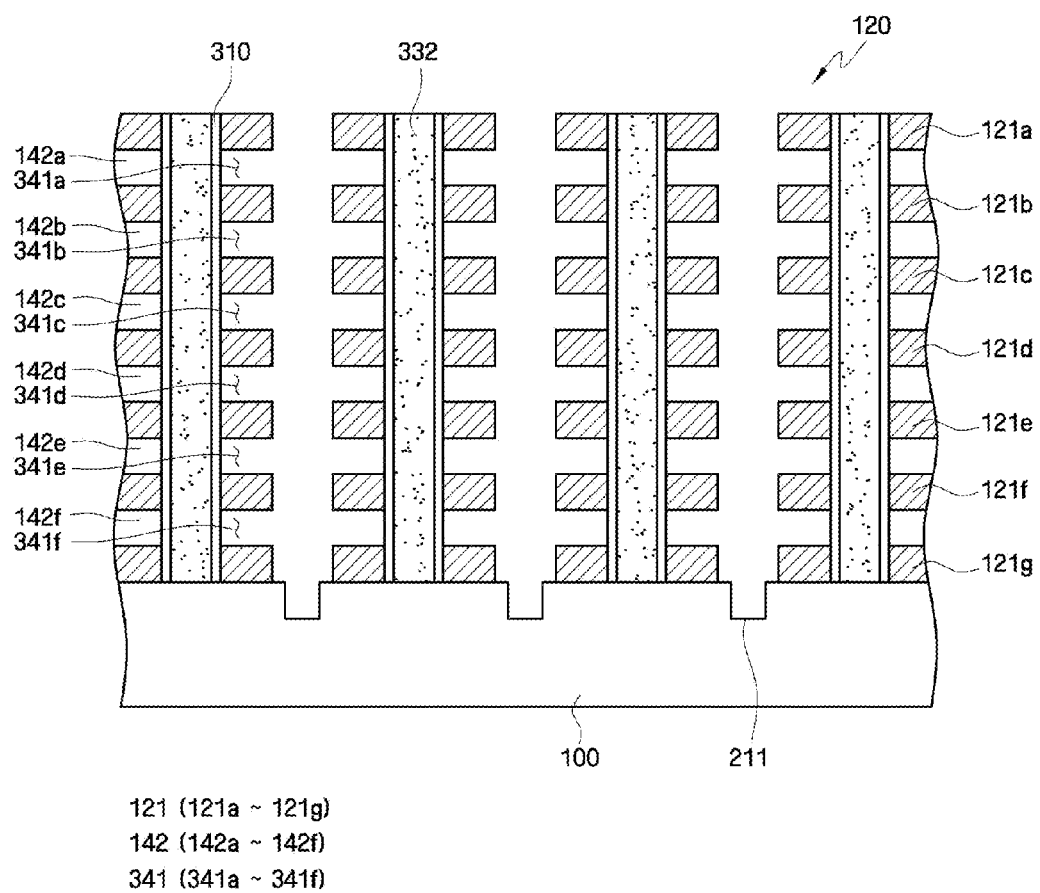
Figure 22B:
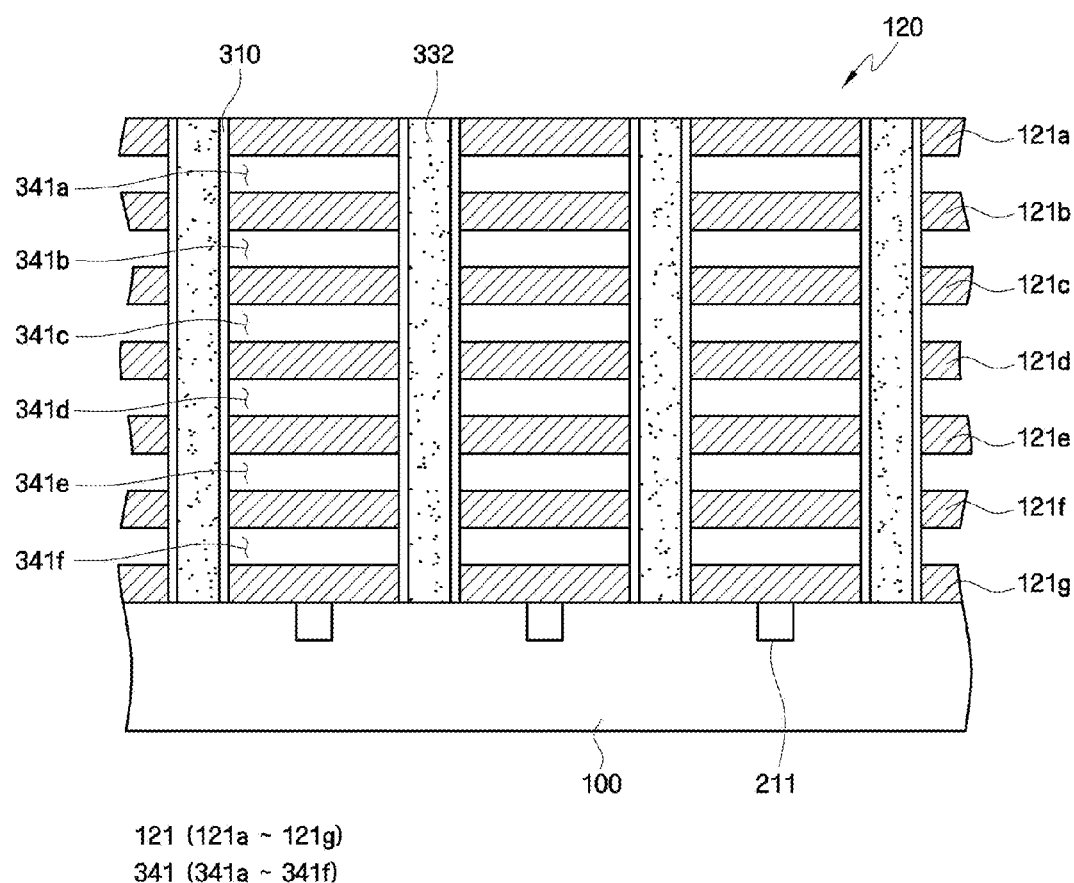

Next, the semiconductor patterns 332 are formed in the hole 131 having the insulating pattern 310. The semiconductor patterns 332 according to this embodiment may be formed in the same manner as the semiconductor patterns 132 according to the previous embodiment shown in FIGS. 7 to 16B, so repeated explanations will be omitted. Referring to FIGS. 21A and 21B, an opening 161 is formed on the resultant structure shown in FIG. 20. The opening 161 according to this embodiment of the inventive concept may be formed in the same manner as the opening 161 according to the previous embodiment shown in FIGS. 1 to 5, so repeated explanations will be omitted. Referring to FIGS. 22A and 22B, sacrificial layers 123a-123f are selectively removed from a mold structure 120 to form a groove group 341 including a plurality of grooves 341a-341f positioned between insulating layers 121a-121g. Additionally, a sacrificial pattern 213 included in a common source line forming structure 215 may also be removed at the same time that the sacrificial layers 123a-123f are removed, which may be achieved when the sacrificial layers 123a-123f and the sacrificial pattern 213 are made of the same material or materials having the same etching selectivity.

In order to remove the sacrificial layers 123a-123f and the sacrificial pattern 213, etchant is injected into the opening 161. The etchant may include, for example, phosphoric acid. As the result of removing the sacrificial pattern 213, a trench 211 may be exposed to the outside by the opening 161.

Figure 23A:
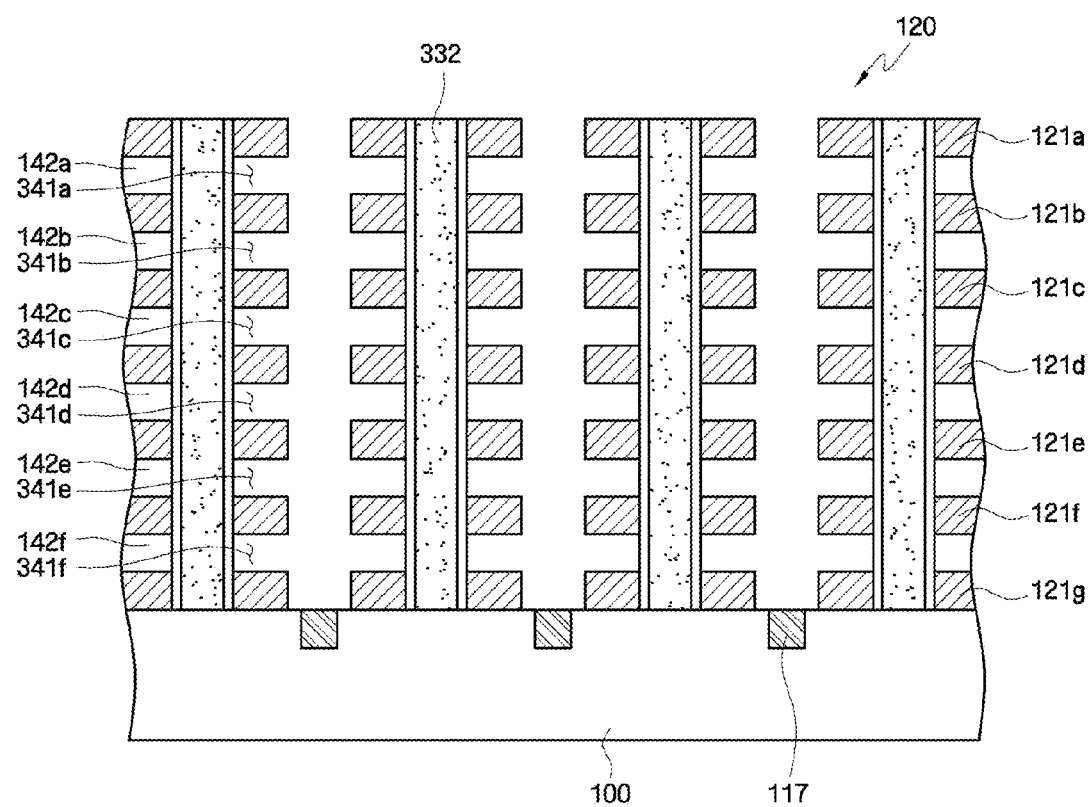
Figure 23B:
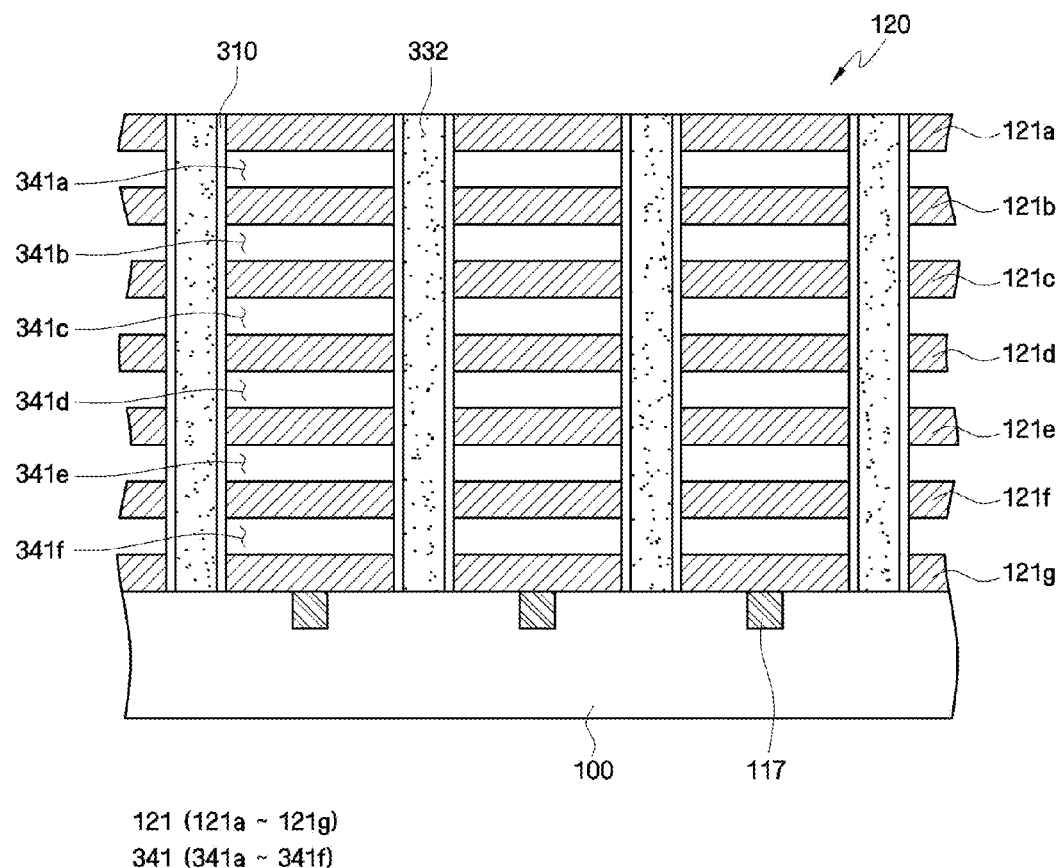

Next, referring to FIGS. 23A and 23B, a common source line 117 is formed.

To this end, a conductive pattern (not shown) is first formed to fill the trench 211. The conductive pattern may be formed by CVD or ALD using cobalt (Co). In addition, silicidation is performed on the conductive pattern under a silicon (Si) gas atmosphere to form the common source line 117. As a result, a first common source line 117 positioned at one side of a memory cell string forming region (see 20 of FIG. 7) and a second common source line 117 positioned at the other side of the memory cell string forming region 20 may be formed.

As described above, an insulating pattern 310 is formed on sidewalls of the hole 131. Thus, even if the plurality of grooves 341a-341f are formed, sidewalls of the semiconductor patterns 332 are not exposed by the insulating pattern 310, thereby preventing the semiconductor patterns 332 from being damaged even if metal deposition and silicidation processes are performed when forming the common source line 117.

Figure 24A:
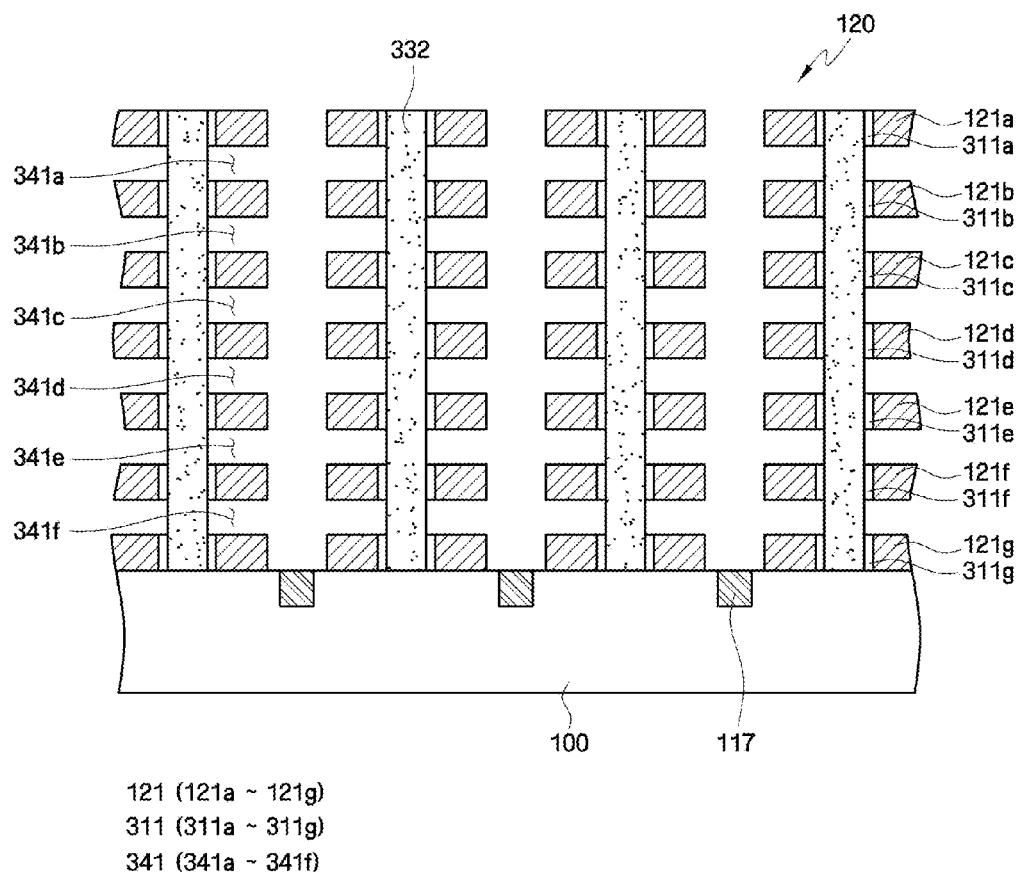
Figure 24B:
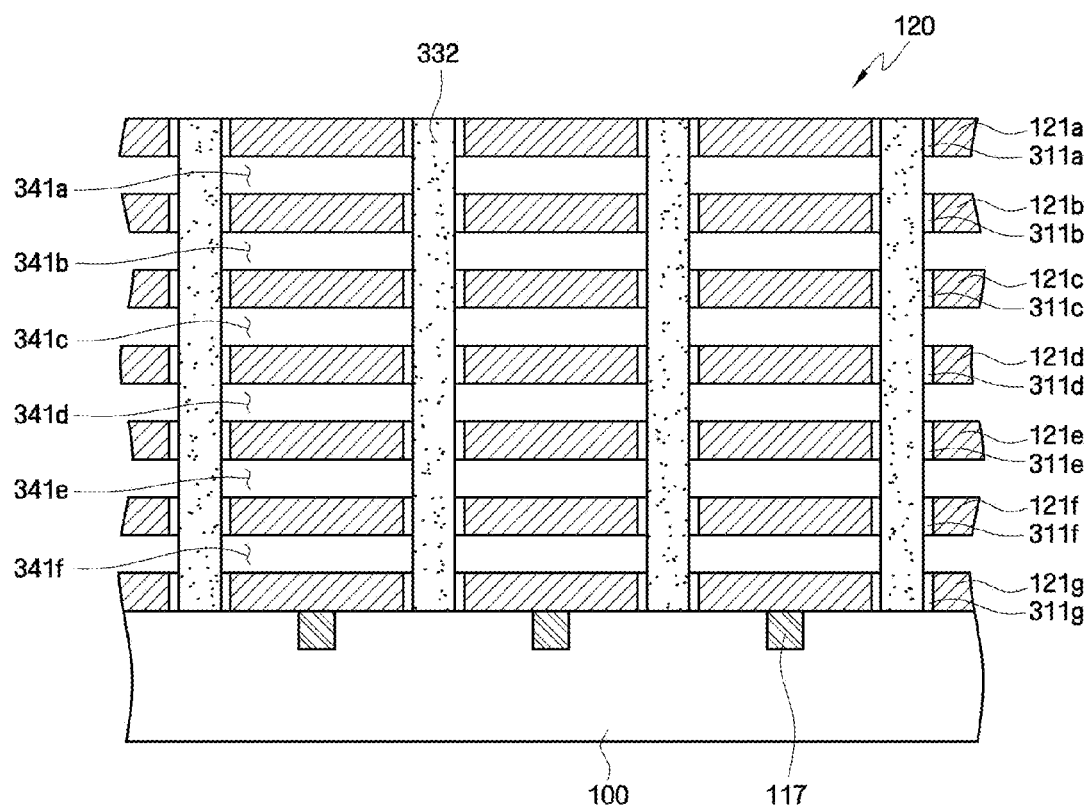

Referring to FIGS. 24A and 24B, a portion of the insulating pattern 310, the portion excluding a portion of the insulating pattern 310 positioned below the insulating layers 121a-121g, is removed. Here, the insulating layers 121a-121g may function as a mask for the insulating pattern 310. Accordingly, the insulating pattern 310 positioned in the grooves 341a-341f may be removed. In addition, the insulating pattern 310 positioned below the insulating layers 121a-121g may be formed as insulating pattern layers 311a-311g.

Next, the processes shown in FIGS. 14A to 16B are performed, thereby completing the nonvolatile memory device shown in FIGS. 18 and 19.

Figure 25:
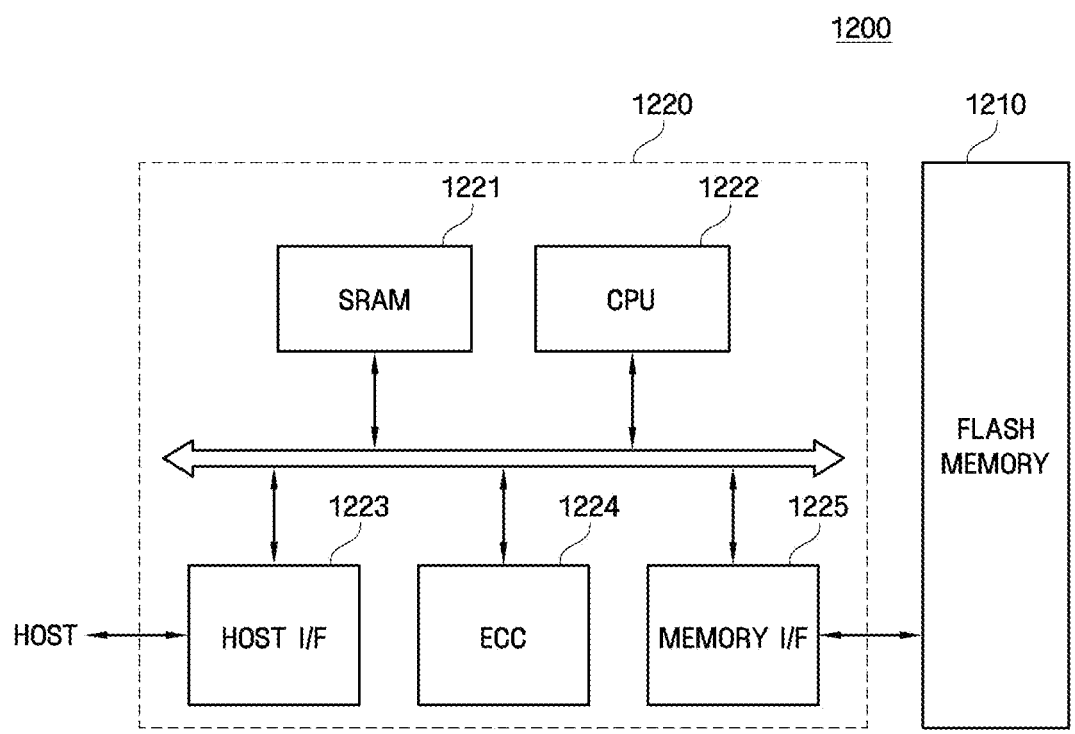
FIG. 25 is a block diagram illustrating an example memory card including a nonvolatile memory device according to exemplary embodiments.
Figure 26:
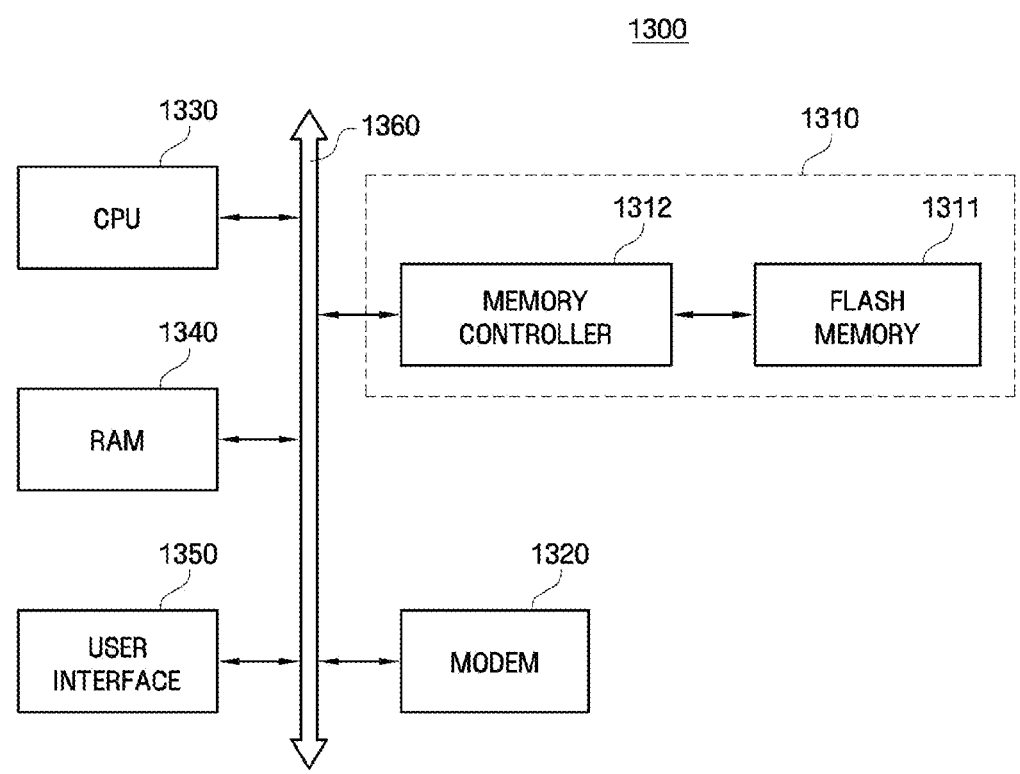
FIG. 26 is a block diagram illustrating an example information processing system including a nonvolatile memory device according to exemplary embodiments.

With reference to FIGS. 25 and 26, applicable examples according to the disclosed embodiments will be described. FIG. 25 is a block diagram illustrating an example memory card including a nonvolatile memory device according to exemplary embodiments, and FIG. 26 is a block diagram illustrating an example information processing system including a nonvolatile memory device according to exemplary embodiments.

Referring to FIG. 25, a memory card 1200 may include a memory such as flash memory 1210 to support data storage capability of high capacity. The flash memory 1210 may include nonvolatile memory devices according to the aforementioned exemplary embodiments, for example, a NAND flash memory device.

The memory card 1200 may comprise a memory controller 1220 for controlling data exchange as a whole between a host and the flash memory 1210. An SRAM 1221 may be used as an operation memory of a central processing unit 1222. A host interface 1223 may have a data exchanging protocol of the host connected to the memory card 1200. An error correction code (ECC) 1224 may detect and correct errors in the data read from the flash memory 1210. The memory interface 1225 may interface with the flash memory 1210. A central processing unit 1222 may execute various control operations for data exchange of the memory controller 1220. Although not shown, the memory card 1200 may provide a read only memory (ROM) to store code data for interfacing with the host.

Referring to FIG. 26, an information processing system 1300 including a nonvolatile memory device according to exemplary embodiments may comprise the nonvolatile memory device according to the aforementioned exemplary embodiments, for example, a NAND flash memory device. The information processing system 1300 may comprise, for example, a mobile device, such as a cellular phone, PDA, personal media player, laptop computer etc., or a desktop computer.

For example, the information processing system 1300 may comprise a memory system 1310, a modem 1320, a central processing unit (CPU) 1330, RAM 1340, and a user interface 1350, which are electrically connected to the memory system 1310 through a system bus 1360. The flash memory system 1310 may store data processed by the CPU 1330 or data input from the outside.

The information processing system 1300 may comprise a memory card, a solid state disk (SSD), a camera image sensor and other application chipsets. In this applicable example, the information processing system 1300 may be configured as a solid state disk (SSD). In this case, the information processing system 1300 may stably store a mass data in the flash memory system 1310.

The nonvolatile memory device according to the disclosed embodiments may be embodied in various types of packages. For example, the nonvolatile memory device may be packaged and mounted in such manners as Package on Package, Ball Grid Arrays, Chip Scale Packages, Plastic Leaded Chip Carrier, Plastic Dual In-Line Package, Multi Chip Package, Wafer-level Package, Wafer-level Fabricated Package, Wafer-Level Processed Stack Package, Die on Waffle Package, Die in Wafer Form, Chip On Board, Ceramic Dual In-Line Package, Plastic Metric Quad Flat Pack, Thin Quad Flatpack, Small Outline Package, Shrink Small Outline Package, Thin Small Outline Package, Thin Quad Flatpack Package, System In Package, and the like.

While the present disclosure has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method for fabricating a nonvolatile memory device, the method comprising:
   forming a first structure for a common source line on a semiconductor substrate, the first structure extending along a first direction;
   forming a mold structure by alternately stacking a plurality of sacrificial layers and a plurality of insulating layers on the semiconductor substrate;
   forming a plurality of openings in the mold structure exposing a portion of the first structure; and
   forming a first memory cell string at a first side of the first structure and a second memory cell string at a second, opposite side of the first structure,
   wherein the plurality of openings include a first through-hole and a second through-hole, heach through-hole passing through the plurality of sacrificial layers and plurality of insulating layers, and the first through-hole and the second through-hole overlap each other in the first direction;
   wherein the forming of the structure comprises forming a trench in the semiconductor substrate extending along the direction, and forming a sacrificial pattern in the trench.

2. The method of claim 1, further comprising:
   forming a common source line, wherein the forming of the common source line comprises forming a conductive pattern in the trench by removing the sacrificial pattern, and performing silicidation on the conductive pattern.

3. The method of claim 1, wherein the sacrificial pattern has the same etching selectivity as the sacrificial layers.

4. The method of claim 1, wherein the forming of the first and second memory cell strings comprises:
   forming semiconductor patterns penetrating the mold structure and extending in a direction perpendicular to the semiconductor substrate;
   forming a plurality of charge storage layers on side surfaces of the semiconductor patterns; and
   forming a plurality of gates around the semiconductor patterns and the charge storage layers.

5. The method of claim 4, wherein the forming of the plurality of charge storage layers comprises:
   forming a plurality of grooves by providing an etchant through at least one of the plurality of openings to remove the sacrificial layers;
   forming a layer for forming a charge storage layer in a portion of the plurality of grooves; and
   removing a portion of the layer for forming a charge storage layer, the portion excluding a contact portion between the layer and the semiconductor patterns.

6. The method of claim 5, wherein the forming of the plurality of gates comprises:
   forming a conductive layer in the grooves and at least the first through-hole; and
   removing a portion of the conductive layer, the portion excluding a portion of the conductive layer positioned in the grooves.

7. The method of claim 6, wherein when at least one first gate electrode included in the first memory cell string is coplanar with at least one second gate electrode included in the second memory cell string, and the first gate electrode and the second gate electrode are electrically connected to each other.

8. The method of claim 7, further comprising electrically insulating a gate among the plurality of gates, which is positioned on the topmost portion of the first memory cell string, from a gate positioned on the topmost portion of the second memory cell string.

9. The method of claim 4, wherein the forming of the semiconductor patterns comprises forming an insulating pattern on side surfaces of the semiconductor patterns, the insulating pattern having different etching selectivity from the sacrificial layers.

10. The method of claim 9, wherein the insulating pattern has etching selectivity in a range between the etching selectivity of the sacrificial layers and the etching selectivity of the insulating layers.

* * * * *